(12) United States Patent
Kim et al.

(10) Patent No.: US 12,414,399 B2
(45) Date of Patent: Sep. 9, 2025

(54) IMAGE SENSOR

(71) Applicant: SAMSUNG ELECTRONICS CO., LTD., Suwon-si (KR)

(72) Inventors: Sanghoon Kim, Suwon-si (KR); Heegeun Jeong, Suwon-si (KR); Taekhwan Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 17/807,026

(22) Filed: Jun. 15, 2022

(65) Prior Publication Data

US 2023/0123890 A1   Apr. 20, 2023

(30) Foreign Application Priority Data

Oct. 14, 2021  (KR) .................. 10-2021-0136692
Dec. 24, 2021  (KR) .................. 10-2021-0186794

(51) Int. Cl.
   *H10F 39/00*   (2025.01)
(52) U.S. Cl.
   CPC ....... *H10F 39/807* (2025.01); *H10F 39/8053* (2025.01); *H10F 39/8063* (2025.01)
(58) Field of Classification Search
   CPC .............. H10F 39/807; H10F 39/8053; H10F 39/8063; H10F 39/18; H10F 39/182; H10F 39/199; H10F 39/811
   See application file for complete search history.

(56) References Cited

U.S. PATENT DOCUMENTS

| | | | |
|---|---|---|---|
| 10,157,948 B2 | 12/2018 | Lee et al. | |
| 10,797,090 B2* | 10/2020 | Perkins | H01L 27/14629 |
| 11,075,236 B2* | 7/2021 | Shiraishi | H01L 27/14627 |
| 11,075,242 B2* | 7/2021 | Kuo | H01L 27/14685 |
| 2015/0340391 A1 | 11/2015 | Webster | |
| 2020/0075643 A1* | 3/2020 | Han | H01L 27/14621 |
| 2020/0119067 A1* | 4/2020 | Choi | H01L 27/14605 |
| 2020/0243578 A1* | 7/2020 | Pyo | H01L 27/14609 |
| 2020/0328238 A1 | 10/2020 | Shim | |
| 2020/0358989 A1* | 11/2020 | Hoshino | H01L 27/14607 |
| 2020/0396388 A1* | 12/2020 | Kim | H04N 25/75 |
| 2021/0351218 A1* | 11/2021 | Kuo | H01L 27/1463 |

* cited by examiner

*Primary Examiner* — Dao H Nguyen
(74) *Attorney, Agent, or Firm* — Morgan, Lewis & Bockius LLP

(57) ABSTRACT

An image sensor includes: a pixel array including a plurality of photodiodes arranged on an upper surface of a substrate, pixel isolation layers extending from the upper surface to a lower surface of the substrate and disposed between the plurality of photodiodes, and pixel circuits. The pixel array includes pixel groups respectively including two or more of the photodiodes, at least one color filter, and at least one microlens. The at least one color filter included in each of the pixel groups has one color, and the pixel isolation layers includes a first pixel isolation layer disposed between the pixel groups and containing silicon oxide and polysilicon; and a second pixel isolation layer containing silicon oxide and extending in a first direction and a second direction, which intersect each other between the two or more photodiodes in each of the pixel groups.

20 Claims, 22 Drawing Sheets

IMAGE SENSOR

CROSS-REFERENCE TO RELATED APPLICATION(S)

This U.S. non-provisional patent application claims priority under 35 USC 119(a) to Korean Patent Application No. 10-2021-0136692 filed on Oct. 14, 2021 and Korean Patent Application No. 10-2021-0186794 filed on Dec. 24, 2021 in the Korean Intellectual Property Office, the disclosures of which are incorporated herein by reference in their entireties herein.

1. TECHNICAL FIELD

The present disclosure relates to an image sensor.

2. DISCUSSION OF RELATED ART

An image sensor receives light and generates an electrical signal from the received light. The image sensor may include a pixel array including a plurality of pixels and a logic circuit for driving the pixel array and generating an image. Each pixel of the pixel array may include a photoelectric conversion element. When the photoelectric conversion element generates an electrical signal varying according to the amount of incident light, the logic circuit may process the electrical signal to generate an image.

An element isolation layer for isolating pixels may be formed between the pixels. A size of each of the pixels tends to decrease according to the demand for miniaturization of the image sensor. As the size of the pixel decreases, an area occupied by the element isolation layer increases, and an influence of light absorbed by the element isolation layer on performance of the image sensor increases.

SUMMARY

At least one embodiment of the present disclosure may provide an image sensor having an increased sensitivity.

According to an embodiment of the present disclosure, an image sensor includes: a pixel array arranged on an upper surface of a substrate, pixel isolation layers extending from the upper surface of the substrate to a lower surface of the substrate and disposed between the plurality of photodiodes, and pixel circuits disposed below each of the plurality of photodiodes; and a logic circuit for obtaining a pixel signal from the pixel circuits. The pixel array includes pixel groups respectively including two or more of the photodiodes, at least one color filter disposed on the substrate, and at least one microlens. The at least one color filter included in each of the pixel groups has one color. The pixel isolation layers include: a first pixel isolation layer disposed between the pixel groups and including silicon oxide and polysilicon; and a second pixel isolation layer including silicon oxide and extending in a first direction and a second direction, which intersect each other between the two or more photodiodes in each of the pixel groups.

According to an embodiment of the present disclosure, an image sensor includes: a pixel array including a plurality of pixels arranged on an upper surface of a substrate, and pixel isolation layers extending from the upper surface of the substrate to a lower surface of the substrate between the plurality of pixels, each of the plurality of pixels including at least one photodiode and a pixel circuit disposed below the at least one photodiode; and a logic circuit for obtaining a pixel signal from the plurality of pixels. The pixel isolation layers include: a first pixel isolation layer including polysilicon having a first transmittance and disposed between pixels adjacent to each other that detect light of different colors among the plurality of pixels; and a second pixel isolation layer disposed between pixels adjacent to each other and that detect light of the same color among the plurality of pixels, having a second transmittance higher than the first transmittance, and extending in a first direction and a second direction, which intersect each other.

According to an embodiment of the present disclosure, an image sensor includes: a pixel array including a plurality of pixels arranged on an upper surface of a substrate, and pixel isolation layers disposed to penetrate through the substrate between the plurality of pixels, each of the plurality of pixels including at least one photodiode and a pixel circuit disposed below the at least one photodiode; and a logic circuit for obtaining a pixel signal from the plurality of pixels. The pixel isolation layers include: a first pixel isolation layer including polysilicon and extending in a first direction and a second direction, which intersect each other; and a second pixel isolation layer including an insulating material and forming a cross shape in the first direction and the second direction in a region formed by the first pixel isolation layer.

BRIEF DESCRIPTION OF DRAWINGS

The above and other aspects and features of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

Figure 1:
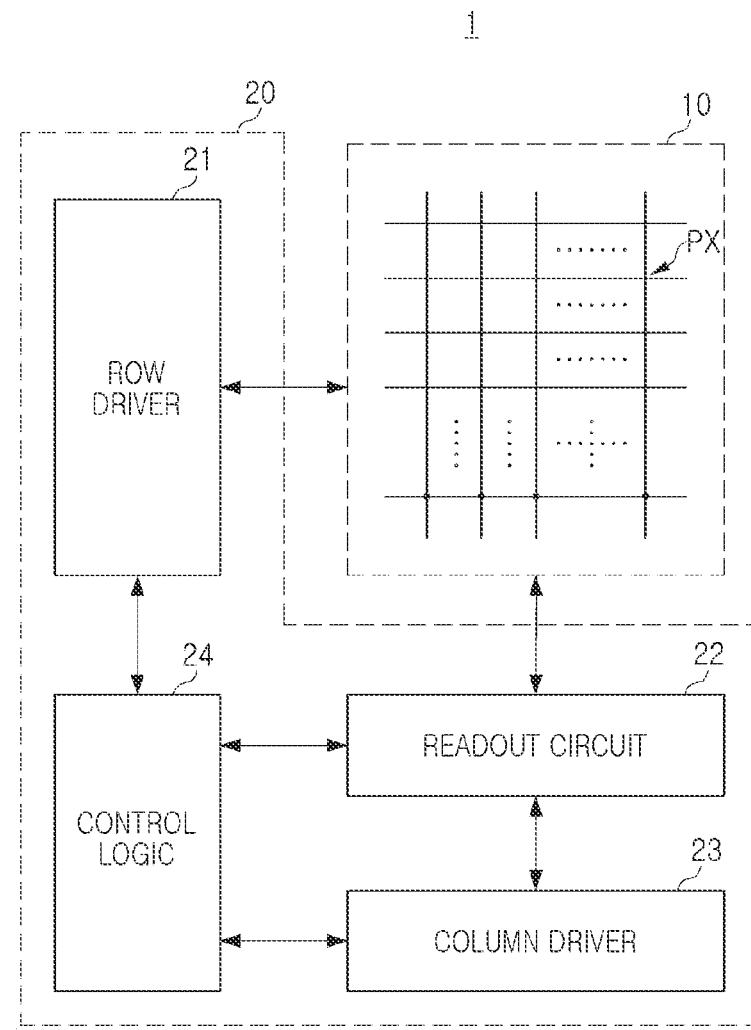
FIG. 1 is a schematic block diagram illustrating an image sensor according to an exemplary embodiment in the present disclosure.

FIG. 1 is a schematic block diagram illustrating an image sensor according to an exemplary embodiment in the present disclosure.

Referring to FIG. 1, an image sensor 1 may include a pixel array 10 (e.g., a display panel) and a logic circuit 20.

The pixel array 10 may include a plurality of pixels PX arranged in an array form in a plurality of rows and a plurality of columns. Each of the plurality of pixels PX may include at least one photoelectric conversion element that generates electric charges in response to light, a pixel circuit that generates a pixel signal corresponding to the electric charges generated by the photoelectric conversion element, and the like. The photoelectric conversion element may include a photodiode formed of a semiconductor material, an organic photodiode formed of an organic material, and/or the like.

For example, the pixel circuit may include a floating diffusion, a transfer transistor, a reset transistor, a driving transistor, a selection transistor, and the like. The configuration of the pixels PX may vary according to exemplary embodiments. For example, each of the pixels PX may include an organic photodiode containing an organic material, or may be implemented as a digital pixel. In a case where the pixels PX are implemented as digital pixels, each of the pixels PX may include an analog-to-digital converter for outputting a digital pixel signal.

The logic circuit 20 may include circuits for controlling the pixel array 10. For example, the logic circuit 20 may include a row driver 21, a readout circuit 22, a column driver 23, control logic 24, and the like. The row driver 21 may drive the pixel array 10 in units of row lines. For example, the row driver 21 may generate a transfer control signal for controlling the transfer transistor of the pixel circuit, a reset control signal for controlling the reset transistor, a selection control signal for controlling the selection transistor, or the like, and input the generated signals to the pixel array 10 in units of row lines. For example, the row driver 21 may sequentially drive pixel rows of the pixel array.

The readout circuit 22 may include a correlated double sampler (CDS), an analog-to-digital converter (ADC), and the like. The correlated double sampler may be connected to the pixels PX through the column lines. The correlated double sampler may read the pixel signal through the column lines from the pixels PX connected to the row line selected by a row line selection signal of the row driver 21. The analog-to-digital converter may convert the pixel signal detected by the correlated double sampler into a digital pixel signal and transfer the digital pixel signal to the column driver 23.

The column driver 23 may include a latch circuit or buffer circuit capable of temporarily storing the digital pixel signal, an amplifier circuit, and the like, and may process the digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23.

Among the pixels PX, the pixels PX that are disposed at the same position in a horizontal direction may share a same column line. For example, the pixels PX that are disposed at the same position in a vertical direction may be simultaneously selected by the row driver 21 and may output the pixel signals through the column lines. According to an exemplary embodiment, the readout circuit 22 may simultaneously acquire the pixel signals from the pixels PX selected by the row driver 21 through the column lines. The pixel signal may include a reset voltage and a pixel voltage, and the pixel voltage may be a voltage in which the electric charges generated in response to the light in each of the pixels PX are reflected to the reset voltage.

Each of the pixels PX may include a color filter having a predetermined color, and may be classified into a red pixel for detecting red light, a green pixel for detecting green light, a blue pixel for detecting blue light, and the like according to a color of the color filter. The color of the color filter is not necessarily limited to red, green, and blue, and the color filter may have a color such as yellow or white according to exemplary embodiments.

At least some of the pixels for detecting light of the same color in the pixel array 10 may be adjacent to each other. The pixels adjacent to each other and for detecting light of the same color may share microlenses to provide auto focusing (AF) of an image, or may include the microlenses individually to provide an image with a high sensitivity and a high signal-to-noise ratio (SNR).

Light introduced from the outside may pass through the color filter and be incident on the photodiode of each of the pixels PX. The light passing through the color filter may enter another adjacent pixel instead of the corresponding pixel according to a propagation direction of the light entering each of the pixels PX. For example, light passing through a green color filter of a green pixel may enter the photodiode of an adjacent blue pixel or may enter the photodiode of an adjacent red pixel. In a case where such optical crosstalk occurs, image quality may be degraded.

In order to reduce an influence of the optical crosstalk, a pixel isolation layer, for example, deep trench isolation (DTI), may be disposed between the pixels PX arranged in the pixel array of the image sensor 1. In order to form the pixel isolation layer, a first material having an excellent light reflection characteristic may be deposited to a small thickness on a side surface of a trench formed in a semiconductor substrate, and a space remaining after the first material is deposited may be filled with a second material. Silicon oxide may be used as the first material.

In a case where polysilicon is used as the second material, polysilicon may effectively prevent the crosstalk between adjacent pixels and is connected to a negative bias voltage to accumulate holes around the pixel isolation layer, such that a dark level characteristic of the image sensor 1 may be improved. However, due to a light absorption characteristic of polysilicon, the amount of light absorbed by the pixel isolation layer may increase, and the sensitivity of the image sensor may deteriorate.

According to an exemplary embodiment of the present disclosure, the pixel isolation layer includes a first pixel isolation layer disposed between the pixels adjacent to each other and that detect light of different colors among the pixels PX, and a second pixel isolation layer disposed between the pixels adjacent to each other that detect light of the same color. In an embodiment, the first pixel isolation layer and the second pixel isolation layer are formed of different materials, respectively.

For example, the first pixel isolation layer may contain polysilicon, such that the crosstalk between the pixels detecting light of different colors may be prevented, and deterioration of the dark level characteristic of the image sensor 1 may be significantly suppressed. In an exemplary embodiment, the second pixel isolation layer does not contain polysilicon, and contains only silicon oxide. Since the second pixel isolation layer does not contain polysilicon, the second pixel isolation layer may absorb less light as compared with the first pixel isolation layer, and thus the sensitivity of the image sensor may be improved.

Figure 2:
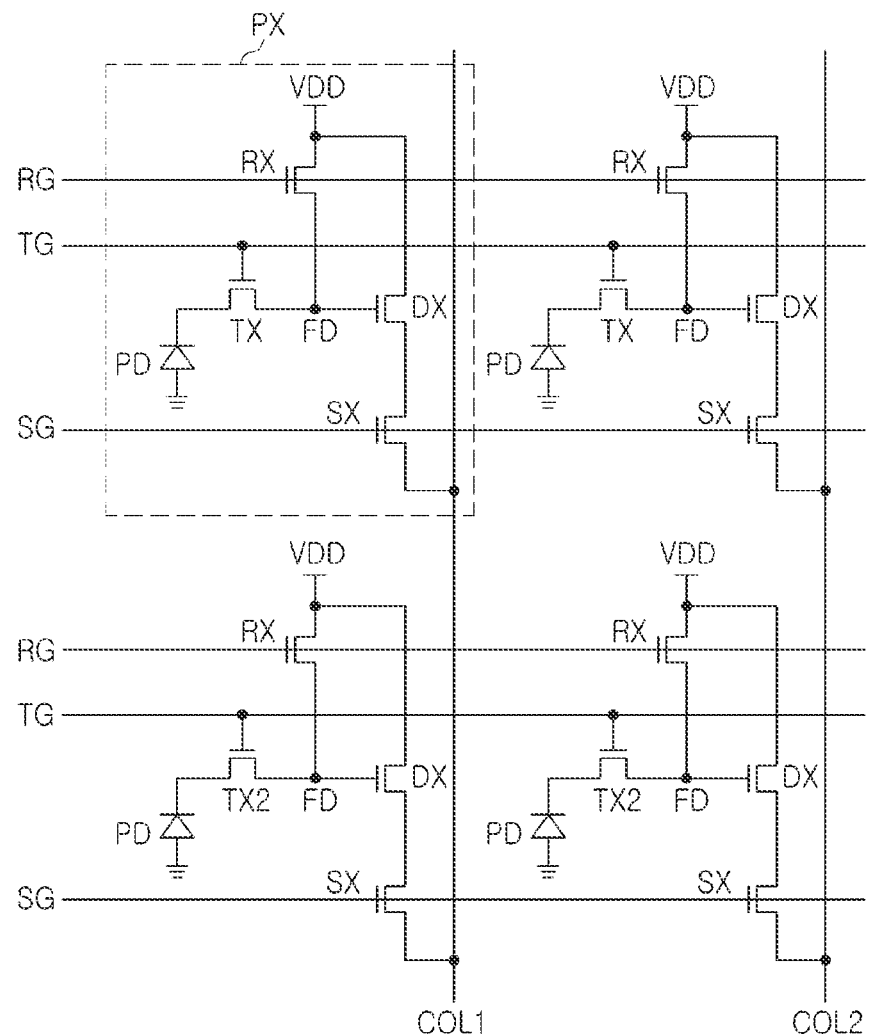
FIGS. 2 and 3 are schematic diagrams illustrating a pixel circuit of the image sensor according to an exemplary embodiment in the present disclosure.
Figure 3:
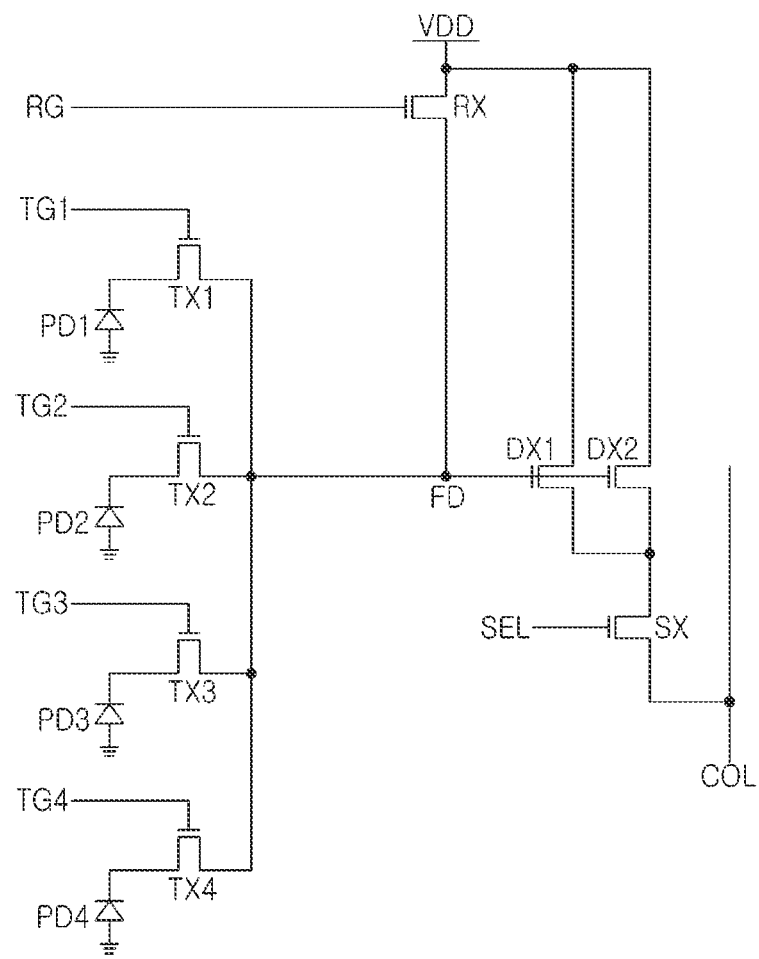

FIGS. 2 and 3 are schematic diagrams illustrating the pixel circuit of the image sensor according to an exemplary embodiment in the present disclosure.

First, referring to FIG. 2, each of the plurality of pixels PX may include a photodiode PD and a pixel circuit. The pixel circuit may include a transfer transistor TX, a reset transistor RX, a selection transistor SX, a driving transistor DX, and the like. In addition, the pixel circuit may include a floating diffusion region FD in which electric charges generated by the photodiode PD are accumulated.

The photodiode PD may generate and accumulate the electric charges in response to light incident from the outside. The photodiode PD may be replaced with a phototransistor, a photogate, a pinned photodiode, or the like according to exemplary embodiments. The transfer transistor TX may move the electric charges generated in the photodiode PD to the floating diffusion region FD. The floating diffusion region FD may store the electric charges generated by the photodiode PD. A voltage output from the driving transistor DX may vary according to the amount of electric charges accumulated in the floating diffusion region FD.

The reset transistor RX may reset a voltage of the floating diffusion region FD by removing the electric charges accumulated in the floating diffusion region FD. A drain electrode of the reset transistor RX may be connected to the floating diffusion region FD, and a source electrode of the reset transistor RX may be connected to a power supply voltage VDD. Once the reset transistor RX is turned on, the power supply voltage VDD connected to the source electrode of the reset transistor RX is applied to the floating diffusion region FD, and the reset transistor RX may remove the electric charges accumulated in the floating diffusion region FD.

The driving transistor DX may be operated as a source follower buffer amplifier. The driving transistor DX may amplify a voltage change in the floating diffusion region FD and output the amplified voltage change to one of column lines COL1 and COL2. The selection transistor SX may select the pixels PX to be read in row units. Once the selection transistor SX is turned on, a voltage of the driving transistor DX may be output to one of the column lines COL1 and COL2. For example, once the selection transistor SX is turned on, the reset voltage or the pixel voltage may be output through the column lines COL1 and COL2.

According to an exemplary embodiment illustrated in FIG. 2, each of the plurality of pixels PX may include the photodiode PD and the transfer transistor TX, as well as the reset transistor RX, the selection transistor SX, and the driving transistor DX. However, as the number of pixels PX included in one image sensor is gradually increasing and an area of each of the pixels PX is decreasing due to limitation of a form factor of the device on which the image sensor is mounted, it may be difficult for each of the pixels PX to include all the elements of the pixel circuit. In this case, two or more pixels PX adjacent to each other in the pixel array of the image sensor may share at least some of the elements included in the pixel circuit. Hereinafter, a more detailed description thereof will be provided with reference to FIG. 4.

Referring to FIG. 3, two or more pixels adjacent to each other may share at least some of transistors included in the pixel circuit. According to an exemplary embodiment illustrated in FIG. 4, four pixels adjacent to each other may share one floating diffusion region FD, one reset transistor RX, driving transistors DX1 and DX2, and the selection transistor SX.

For example, a first photodiode PD1 of the first pixel and a first transfer transistor TX1 may be connected to the floating diffusion region FD. Similarly, second to fourth photodiodes PD2 to PD4 of the second to fourth pixels PX2 to PX4 may be connected to the floating diffusion region FD through second to fourth transfer transistors TX2 to TX4. For example, the floating diffusion regions FD included in the respective pixels may be connected to each other by using a wiring pattern or the like, such that the first to fourth transfer transistors TX1 to TX4 may be commonly connected to one floating diffusion region FD.

Meanwhile, the pixel circuit may include the reset transistor RX, first and second driving transistors DX1 and DX2, and the selection transistor SX. The reset transistor RX may be controlled by a reset control signal RG, and the selection transistor SX may be controlled by a selection control signal SEL. For example, each of the four pixels may further include one transistor in addition to the transfer transistor TX. Two of the four transistors included in the four pixels may be connected to each other in parallel to provide the first and second driving transistors DX1 and DX2, and one of the remaining two transistors may be the selection transistor SX, and the other one may be the reset transistor RX.

However, the pixel circuit described with reference to FIG. 3 is only one example, and is not necessarily limited to such a form. For example, one of the four transistors may be allocated as the driving transistor, and one of the four transistors may be allocated as the selection transistor. In addition, the remaining two may be connected to each other in series and allocated as first and second reset transistors, such that an image sensor capable of adjusting a pixel conversion gain may be implemented. Alternatively, the pixel circuit may vary according to the number of transistors included in each of the pixels.

Figure 4:
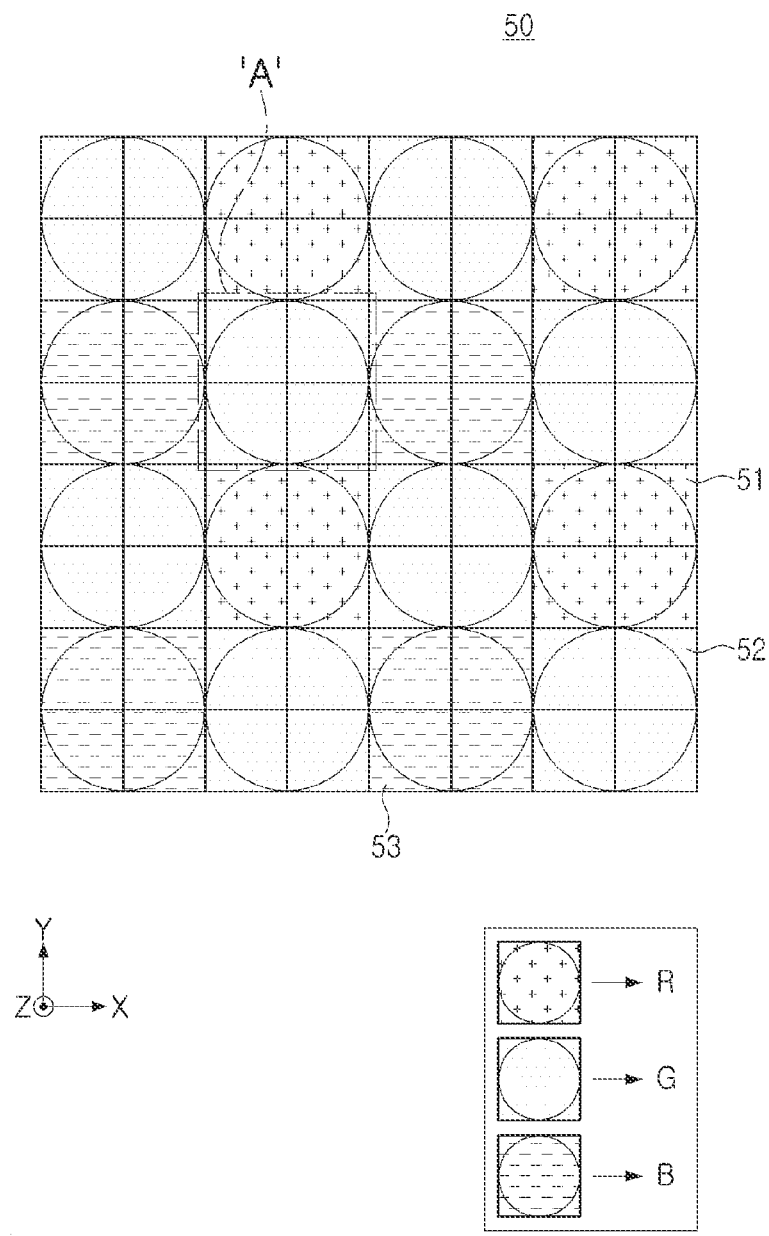
FIG. 4 is a schematic view illustrating a pixel array of the image sensor according to an exemplary embodiment in the present disclosure.

FIG. 4 is a schematic view illustrating a pixel array of the image sensor according to an exemplary embodiment in the present disclosure.

Referring to FIG. 4, a pixel array 50 of the image sensor according to an exemplary embodiment in the present disclosure may include a plurality of pixels 51 to 53 arranged in a first direction X and a second direction Y. For example, the pixel array 50 may include red pixels 51, green pixels 52, and blue pixels 53. Each of the red pixels 51 may include a red color filter, each of the green pixels 52 may include a green color filter, and each of the blue pixels 53 may include a blue color filter. However, according to exemplary embodiments, the pixel array 50 may further include at least one yellow pixel, at least one white pixel, and the like.

According to an exemplary embodiment illustrated in FIG. 4, the pixels for detecting light of the same color may form a pixel group. The pixels included in the pixel group may share a microlens. FIG. 4 illustrates an example of a region A in which one pixel group including the green pixels is located.

The pixel groups that detect light of different colors may be adjacent to each other. For example, a green pixel group may be adjacent to a blue pixel group in the first direction X, and may be adjacent to a red pixel group in the second direction Y.

For example, the pixel array 50 may include a photodiode array, a color filter array, a microlens array, and the like. The photodiode array may include a plurality of photodiodes formed on the semiconductor substrate in the first direction and the second direction, and the plurality of photodiodes may be isolated from each other in the first direction X and the second direction Y by the pixel isolation layer.

Meanwhile, the color filter array may include a plurality of color filters arranged on one surface of the semiconductor substrate in the first direction X and the second direction Y, and the plurality of color filters may be isolated from each other in the first direction and the second direction by a filter isolation layer. The microlens array may be disposed above the color filter array, and thus the color filter array may be disposed between the microlens array and the photodiode array in a third direction Z.

According to an exemplary embodiment, each of the plurality of pixels 51 to 53 may include photodiodes corresponding to one pixel, and may include color filters and microlenses shared by one or more pixels. In the example of FIG. 2, the pixels arranged in a 2×2 matrix structure may share one color filter and one microlens. In a case where multiple photodiodes process light entering from one microlens, the auto focusing (AF) may be implemented.

Meanwhile, in a case where a propagation direction of light incident on each of the plurality of pixels 51 to 53 forms a predetermined angle with respect to the third direction Z, optical crosstalk may occur. For example, in a case where the propagation direction of the light is not parallel to the third direction Z and is inclined in the first direction X, at least a part of the light passing through the red color filter may enter the green pixels 52 adjacent to the red pixels 51 in the first direction X. Alternatively, at least a part of the light passing through the green color filter may enter the red pixels 51 adjacent to the green pixels 52 in the first direction X. The optical crosstalk may also occur between the green pixels 52 and the blue pixels 53 according to a similar principle. The optical crosstalk may also occur between the adjacent red pixels 51, between the adjacent green pixels 52, and between the adjacent blue pixels 53.

According to an exemplary embodiment in the present disclosure, the first pixel isolation layer disposed between the pixels that detect light of different colors contain polysilicon. Due to the light absorption characteristic of polysilicon, the optical crosstalk that may occur between the pixels that detect light of different colors may be prevented.

In an embodiment, the second pixel isolation layer disposed between the pixels that detect light of the same color contains only silicon oxide. Since the second pixel isolation layer that does not contain polysilicon may absorb less light as compared with the first pixel isolation layer, the overall sensitivity of the image sensor may be improved.

Meanwhile, in a case where the second pixel isolation layer does not contain polysilicon, the optical crosstalk may occur between the pixels disposed on both sides of the second pixel isolation layer. However, since the pixels disposed on both sides of the second pixel isolation layer detect light of the same color, image quality degradation due to the optical crosstalk may be significantly suppressed.

Figure 5:
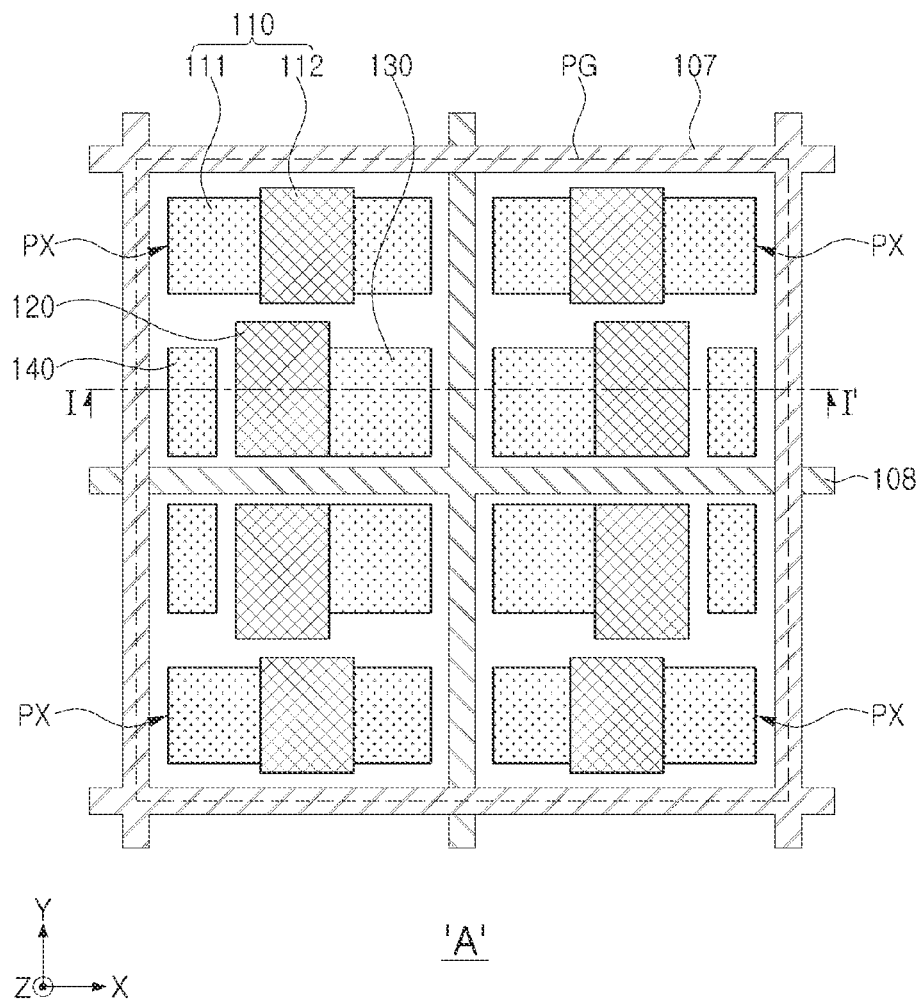
FIGS. 5 and 6 are views illustrating the pixel array of the image sensor according to an exemplary embodiment in the present disclosure.
Figure 6:
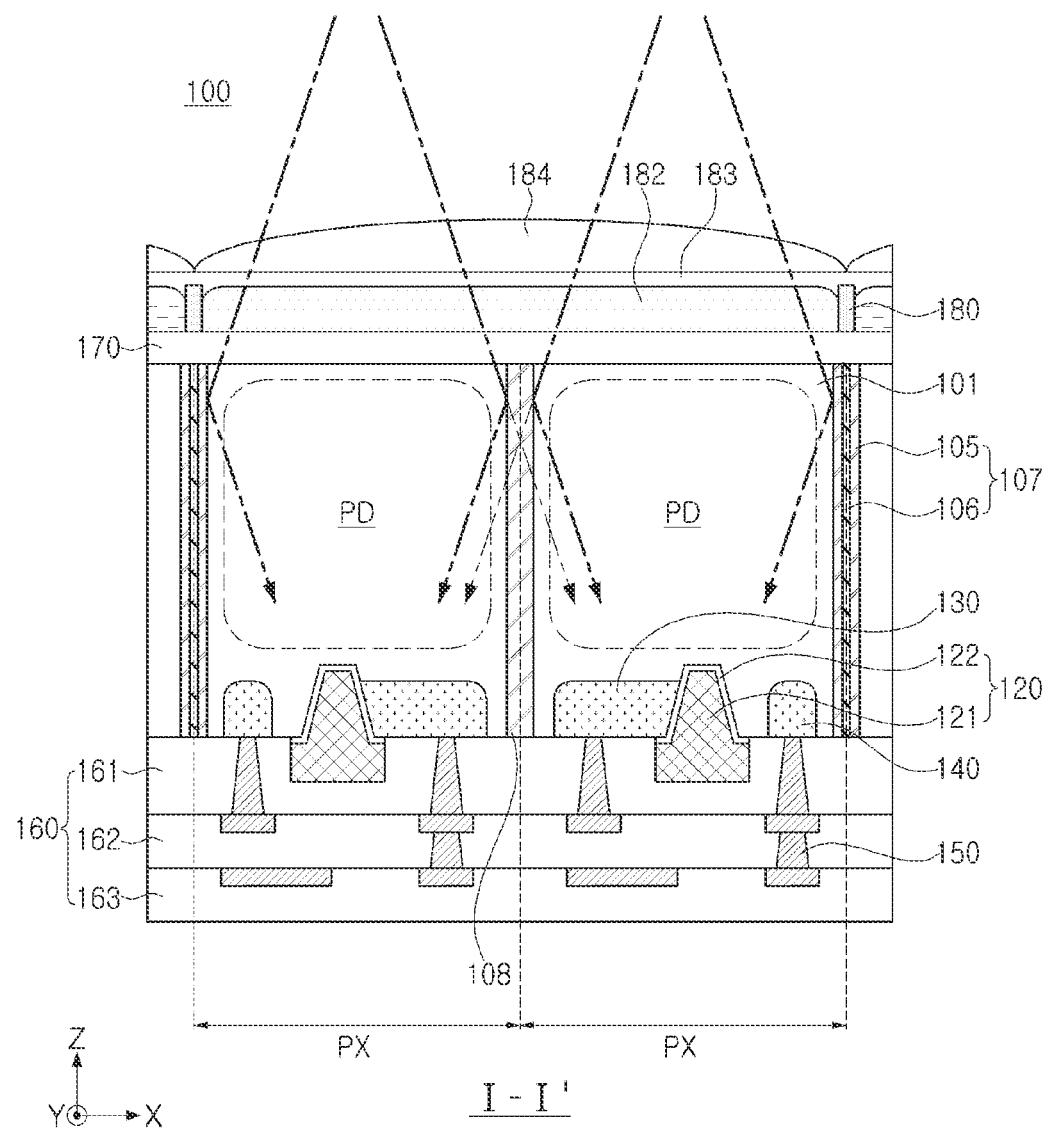

FIGS. 5 and 6 are views illustrating the pixel array of the image sensor according to an exemplary embodiment in the present disclosure.

For example, FIG. 5 may be an enlarged view of the region A of the pixel array 50 described with reference to FIG. 4, and FIG. 6 may be a cross-sectional view illustrating a cross-section taken along line I-I' of FIG. 5.

Referring to FIGS. 5 and 6, the plurality of pixels PX may be disposed in a plurality of pixel regions arranged in the first direction X and the second direction Y parallel to an upper surface of a substrate 101. As described with reference to FIG. 2, the pixels adjacent to each other and that detect light of the same color may form a pixel group. FIG. 5 illustrates a pixel group PG in which the pixels PX for detecting light of the same color are arranged in a 2×2 matrix structure or matrix shape.

A plurality of pixel groups may be defined by a first pixel isolation layer 107. That is, the first pixel isolation layer 107 may be disposed between the pixel groups. For example, the first pixel isolation layer 107 may be disposed between a pair of adjacent pixel groups and may surround pixels within a given one of the pixel groups. The adjacent pixel groups may include the pixels for detecting light of different colors, and the pixels for detecting light of different colors may be adjacent to both sides of the first pixel isolation layer 107.

A plurality of pixels PX may be disposed inside the first pixel isolation layer 107. The pixels PX included in the pixel group PG may be defined by a second pixel isolation layer 108. The pixel group PG may include the pixels for detecting light of the same color, and the pixels for detecting light of the same color may be adjacent to both sides of the second pixel isolation layer 108. The second pixel isolation layer 108 may extend in a cross or plus shape in the first direction X and the second direction Y between the pixels in a region formed by the first pixel isolation layer 107. In an embodiment, the second pixel isolation layer 108 includes a first portion extending in the first direction X and a second portion extending in the second direction Y that crosses the first portion. In an embodiment, the second portion crosses a center portion of the first portion. In an embodiment the first and second portions have a rectangular shape, but is not limited thereto. For example, the first and second portions may be cylindrically shaped, pillar shaped, etc.

According to an exemplary embodiment in the present disclosure, the first and second pixel isolation layers 107 and 108 are formed of different materials. For example, the first pixel isolation layer 107 may contain or include polysilicon, and the second pixel isolation layer 108 does not contain or include polysilicon and may be formed of silicon oxide. For example, the second pixel isolation layer 108 may be formed entirely of silicon oxide or another insulating material with a higher transmittance than polysilicon.

Referring to FIG. 5, each of the plurality of pixels PX may include a pixel circuit region disposed inside the pixel isolation layers 107 and 108. For example, the pixel circuit region may include at least one transistor 110, a transfer gate structure 120, a floating diffusion region 130, and an impurity region 140.

The floating diffusion region 130 may be a region doped with a first conductive impurity, and may be a region in which electric charges generated by the photodiode are accumulated. The floating diffusion region 130 may be adjacent to the transfer gate structure 120. The transfer gate structure 120 may be adjacent to the photodiode formed inside the pixel isolation layer 107 in the third direction (Z-axis direction). For example, the first conductive impurity may have an N-type impurity. A shape of the floating diffusion region 130 is not limited that illustrated in FIG. 5 and may be variously modified according to exemplary embodiments.

Once a first bias voltage is input to the transfer gate structure 120, the electric charges generated from the photodiode may not move to the floating diffusion region 130. When a voltage of the transfer gate structure 120 increases to a second bias voltage higher than the first bias voltage, the electric charges generated in the photodiode may move to the floating diffusion region 130. For example, the first bias voltage may be a negative voltage, and the second bias voltage may be a positive voltage. An absolute value of the first bias voltage may be smaller than an absolute value of the second bias voltage.

A transistor 110 may correspond to at least one of the reset transistor, the selection transistor, or the driving transistor included in the pixel circuit. As described above with reference to FIG. 3, two or more pixels PX adjacent to each other may share the transistor 110, thereby implementing the pixel circuit. Referring to FIG. 5, the transistor 110 may include a gate structure 112 and source and drain regions 111 on both sides of the gate structure 112. According to an exemplary embodiment, an area of each of the source and drain regions 111 may be smaller than an area of the floating diffusion region 130. This may be because the floating diffusion region 130 in which the electric charges generated from the photodiode are accumulated needs to have a relatively larger area.

Each of the plurality of pixels PX may include at least one impurity region 140 isolated from the floating diffusion region 130 and the transistor 110. For example, as illustrated in FIG. 5, the floating diffusion region 130 may be disposed on one side of the transfer gate structure 120, and the impurity region 140 may be disposed on the other side of the transfer gate structure 120. However, the impurity region 140 does not directly contact the transfer gate structure 120 and may be isolated from the transfer gate structure 120 by an element isolation layer. According to an exemplary embodiment, the impurity region 140 may be doped with a second conductive impurity different from that of the floating diffusion region 130 and the source/drain regions 111 of the transistor 110. A ground voltage may be input to the impurity region 140.

Referring to FIG. 6, a substrate 101 of the image sensor 100 may have a first surface and a second surface facing each other in the third direction Z. For example, an optical unit may be disposed on the first surface, and wiring patterns 150 and an interlayer insulating layer 160 may be disposed on the second surface. The wiring patterns 150 may connect the transistor 110, the transfer gate structure 120, the floating diffusion region 130, and the impurity region 140 to each other to provide the pixel circuit. The interlayer insulating layer 160 may include a plurality of interlayer insulating layers 161 to 163, and may cover the transistor 110, the transfer gate structure 120, the floating diffusion region 130, the impurity region 140, and the wiring patterns 150. For example, the interlayer insulating layer 160 may be formed of silicon oxide, silicon nitride, or the like.

The optical unit disposed on the first surface of the substrate 101 may include a horizontal insulating layer 170, a filter isolation layer 180, color filters 182, a planarization layer 183, and microlenses 184. For example, one of the color filters 182 disposed over a red pixel may filter out light other than red light, one of the color filters 182 disposed over a green pixel may filter out light other than green light, and one of the one of the color filters 182 disposed over a blue pixel may filter out light other than blue light.

According to an exemplary embodiment, the pixels PX included in one pixel group PG may share one microlens 184 and one color filter 182. The filter isolation layer 180 may have a checkerboard or grid shape extending in the first direction X and the second direction Y similarly to the pixel isolation layer 107, and the color filters 182 adjacent to each other in the first direction X and the second direction Y may be isolated from each other by the filter isolation layer 180. The filter isolation layer 180 and the color filters 182 may provide the color filter array, and the microlenses 184 may provide the microlens array. Meanwhile, the second pixel isolation layer 108 extending in the first direction X and the second direction Y may form a cross or plus shape at a central portion of the microlens 184.

Light passing through the optical unit may enter the photodiode PD included in each of the plurality of pixels PX. According to an exemplary embodiment illustrated in FIGS. 5 and 6, each of the plurality of pixels PX includes one photodiode PD. However, at least one of the plurality of pixels PX may include two or more photodiodes PD according to exemplary embodiments.

Light entering the image sensor 100 may first be refracted by the microlenses 184, pass through the planarization layer 183, and then enter the color filters 182. Light having a predetermined wavelength band may be filtered by the color filters 182, and the filtered light may pass through the horizontal insulating layer 170 and enter the photodiode PD of each of the plurality of pixels PX.

According to an exemplary embodiment in the present disclosure, the first pixel isolation layer 107 and the second pixel isolation layer 108 are implemented with different materials. Specifically, silicon oxide having an excellent light reflection characteristic may be deposited on a surface of the first pixel isolation layer 107, and a space remaining after the silicon oxide is deposited may be filled with polysilicon. That is, in the first pixel isolation layer 107, silicon oxide may contact the substrate 101, and polysilicon may be disposed inside the silicon oxide. Accordingly, as illustrated in FIG. 6, a problem that light passing through the color filter enters the pixels detecting light of different colors may be prevented.

In an embodiment, the second pixel isolation layer 108 includes only silicon oxide. As illustrated in FIG. 6, a part of the light passing through the color filter 181 and reaching the second pixel isolation layer 108 may be reflected by the second pixel isolation layer 108, but the other part of the light may pass through the second pixel isolation layer 108 and enter an adjacent pixel. That is, the crosstalk may occur between the pixels that detect light of the same color. However, the crosstalk between the pixels that detect light of the same color may not have a significant adverse influence on the image quality, but rather the sensitivity of the image sensor may be increased because the amount of light absorbed by the pixel isolation layer is reduced.

FIGS. 7 through 17 are views illustrating a method for manufacturing the image sensor according to an exemplary embodiment in the present disclosure.

Figure 7:
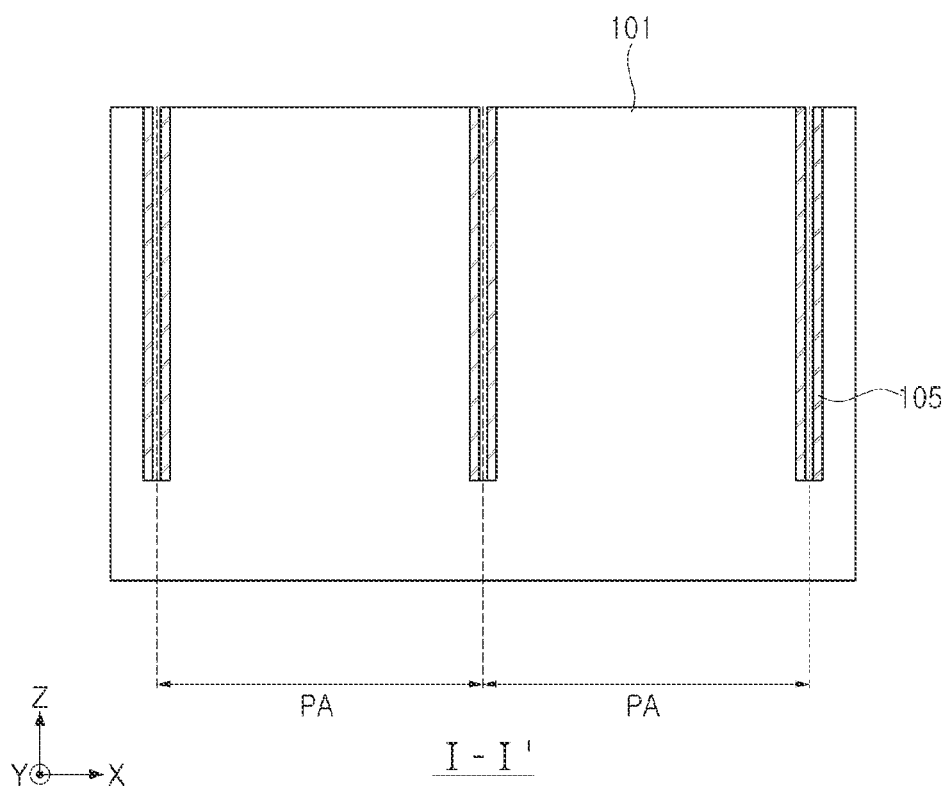
FIGS. 7 through 17 are views illustrating a method for manufacturing the image sensor according to an exemplary embodiment in the present disclosure.
Figure 8:
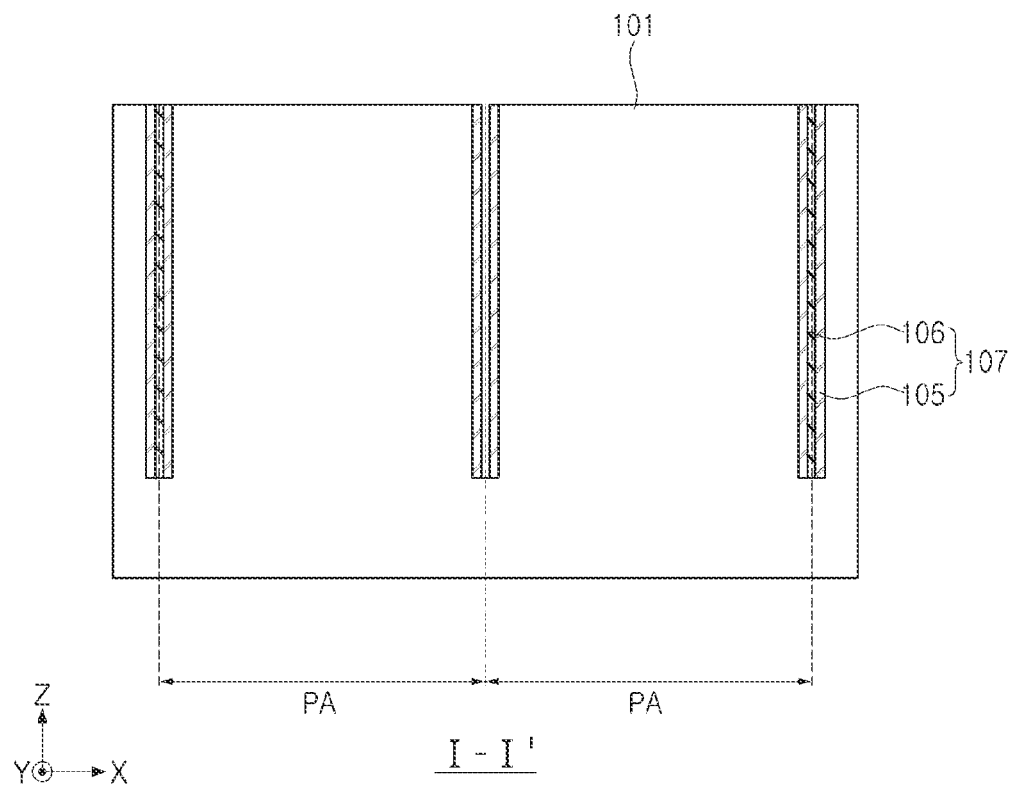
Figure 9:
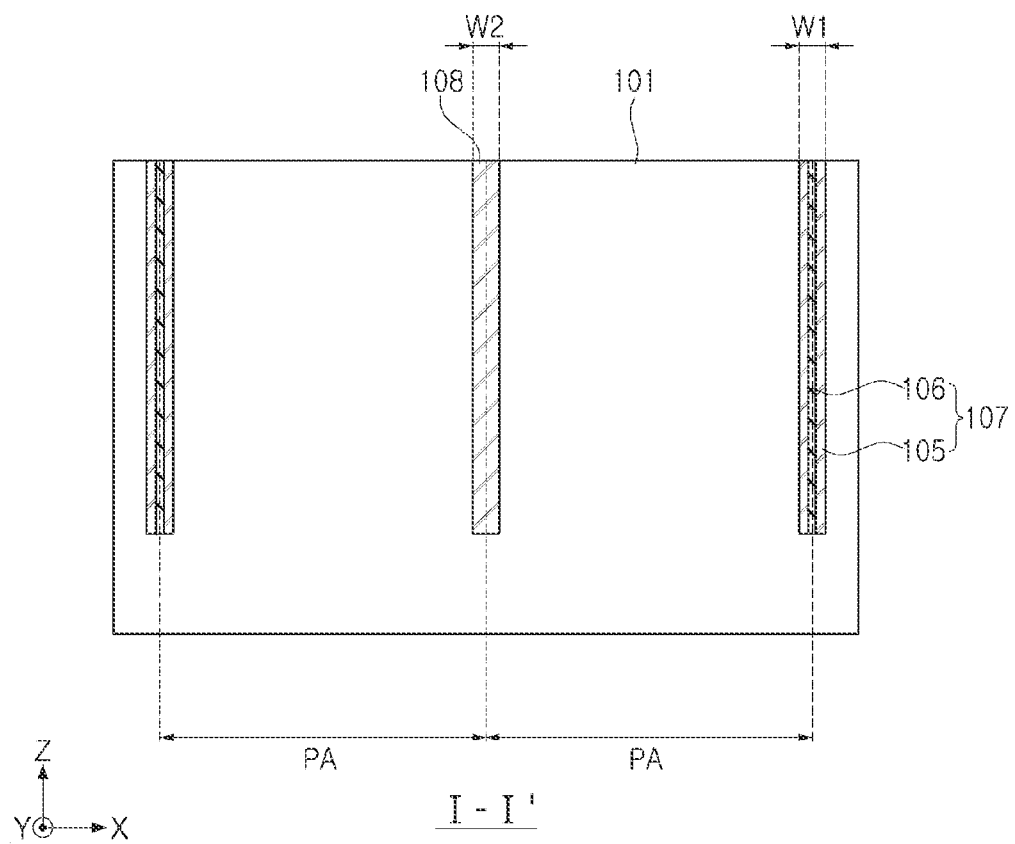

First, referring to FIGS. 7 through 9, the method for manufacturing the image sensor according to an exemplary embodiment in the present disclosure may start with defining a plurality of pixel regions PA in which a plurality of pixels are to be formed by forming the pixel isolation layers 107 and 108 on the substrate 101 containing a semiconductor material. As described above, the pixel isolation layers 107 and 108 may extend in the first direction X and the second direction Y. The plurality of pixel regions PA arranged in the first direction X and the second direction Y may be defined by the pixel isolation layers 107 and 108.

Specifically, referring to FIG. 7, trenches extending in the third direction Z perpendicular to one surface of the substrate 101 may be formed, and silicon oxide 105 may be deposited on side surfaces of the trenches at a small thickness, for example, a thickness of 200 Angstrom Å or less. A gap may remain in the trenches in which the silicon oxide 105 is deposited.

Referring to FIG. 8, the first pixel isolation layer 107 may be formed by filling some of the trenches in which the silicon oxide 105 is deposited with polysilicon 106. The pixel group may be defined by the first pixel isolation layer 107.

Referring to FIG. 9, the second pixel isolation layer 108 may be formed by filling, with silicon oxide, the remaining trenches that are not filled with the polysilicon 106 among the trenches in which the silicon oxide 105 is deposited. The pixel regions PA may be defined by the pixel isolation layers 107 and 108.

Meanwhile, in the embodiment of FIG. 9, a thickness W1 of the first pixel isolation layer 107 and a thickness W2 of the second pixel isolation layer 108 may be the same. In order to form the pixel isolation layers 107 and 108 to have the same thickness, silicon oxide may be formed in twice as described in FIGS. 7 and 9 when the second pixel isolation layer 108 is formed. However, in the present disclosure, a process of forming the pixel isolation layers 107 and 108, or the thickness of the pixel isolation layers 107 and 108 are not limited to those described with reference to FIGS. 7 through 9.

Figure 10:
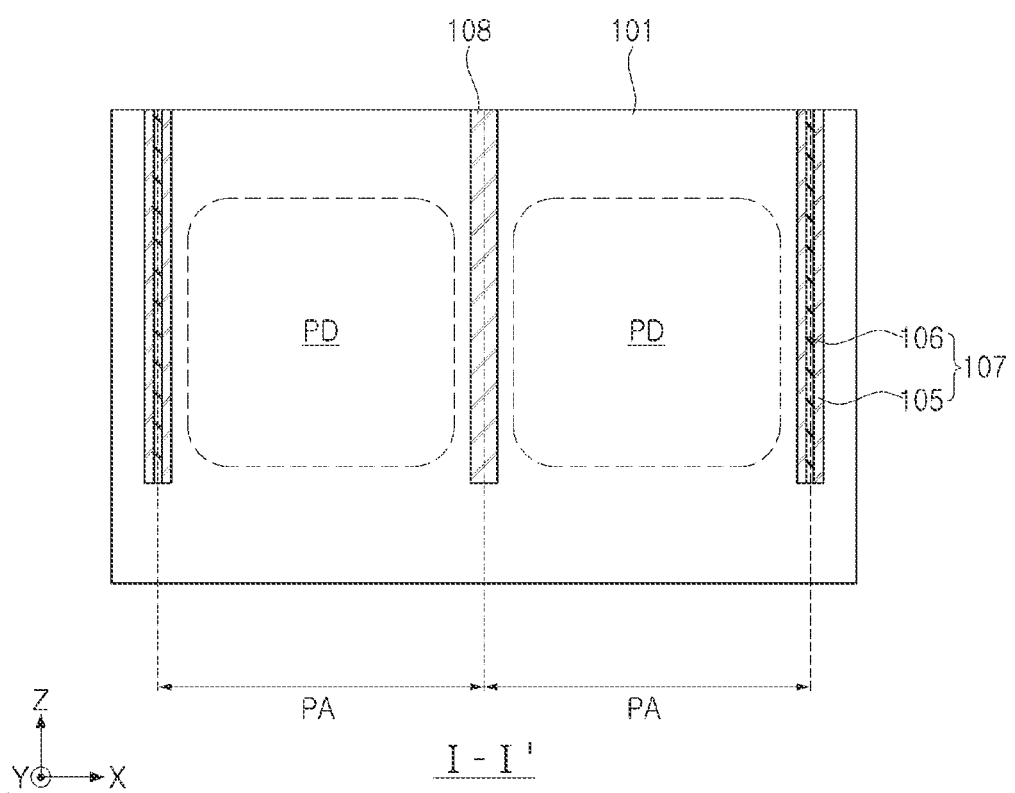

The photodiode PD may be formed in each of the plurality of pixel regions PA as illustrated in FIG. 10. However, according to exemplary embodiments, the photodiode PD may be replaced with another photoelectric conversion element. The photodiode PD may be formed by doping the substrate 101 with a predetermined impurity. For example, the photodiode PD may be formed at a predetermined depth from an upper surface of the substrate 101.

Figure 11:
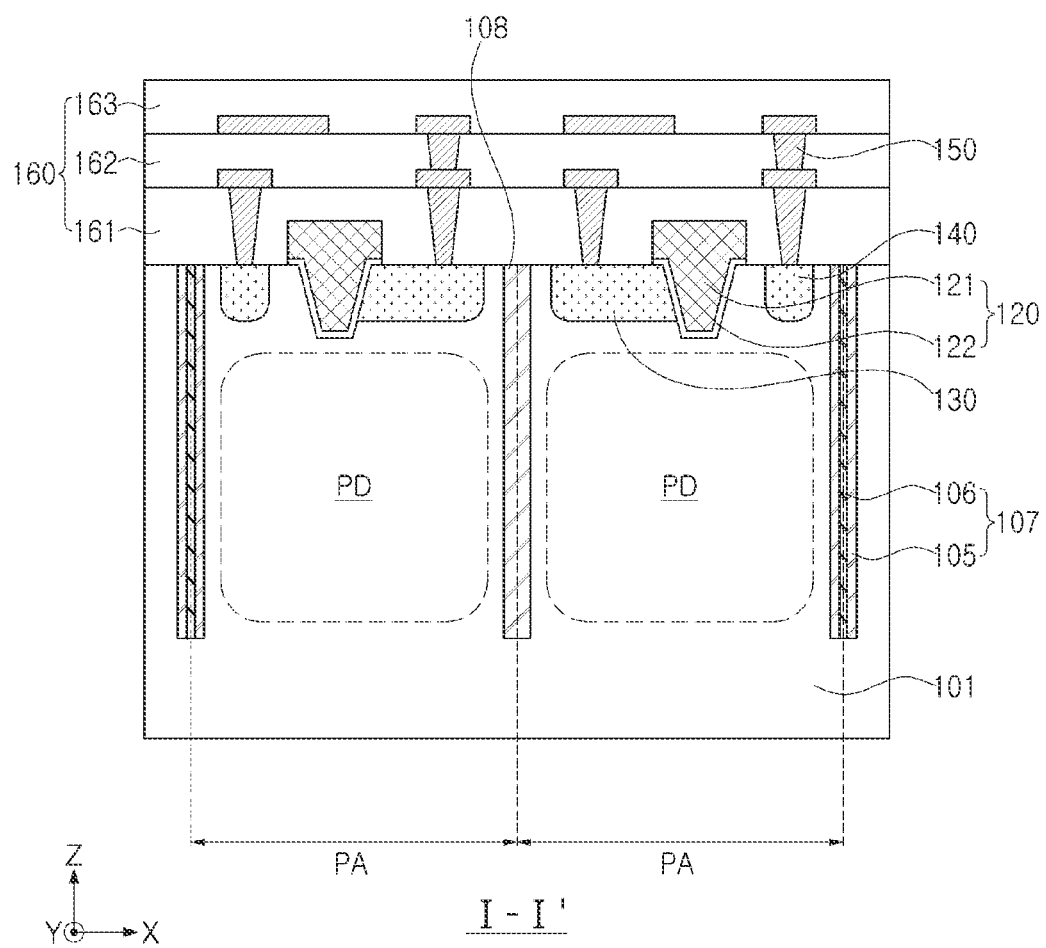

Next, referring to FIG. 11, the pixel circuit region may be formed. The pixel circuit region may include the transfer gate structure 120, the floating diffusion region 130, and the impurity region 140 formed in the substrate 101, and may include the wiring patterns 150, the interlayer insulating layer 160, and the like formed on the substrate 101. According to an exemplary embodiment, the pixel circuit region may further include at least one transistor in addition to the transfer gate structure 120, the floating diffusion region 130, and the impurity region 140. The interlayer insulating layer 160 may include the plurality of interlayer insulating layers 161 to 163. Elements included in the pixel circuit region may be connected to each other by the wiring patterns 150 to provide the pixel circuit.

Figure 12:
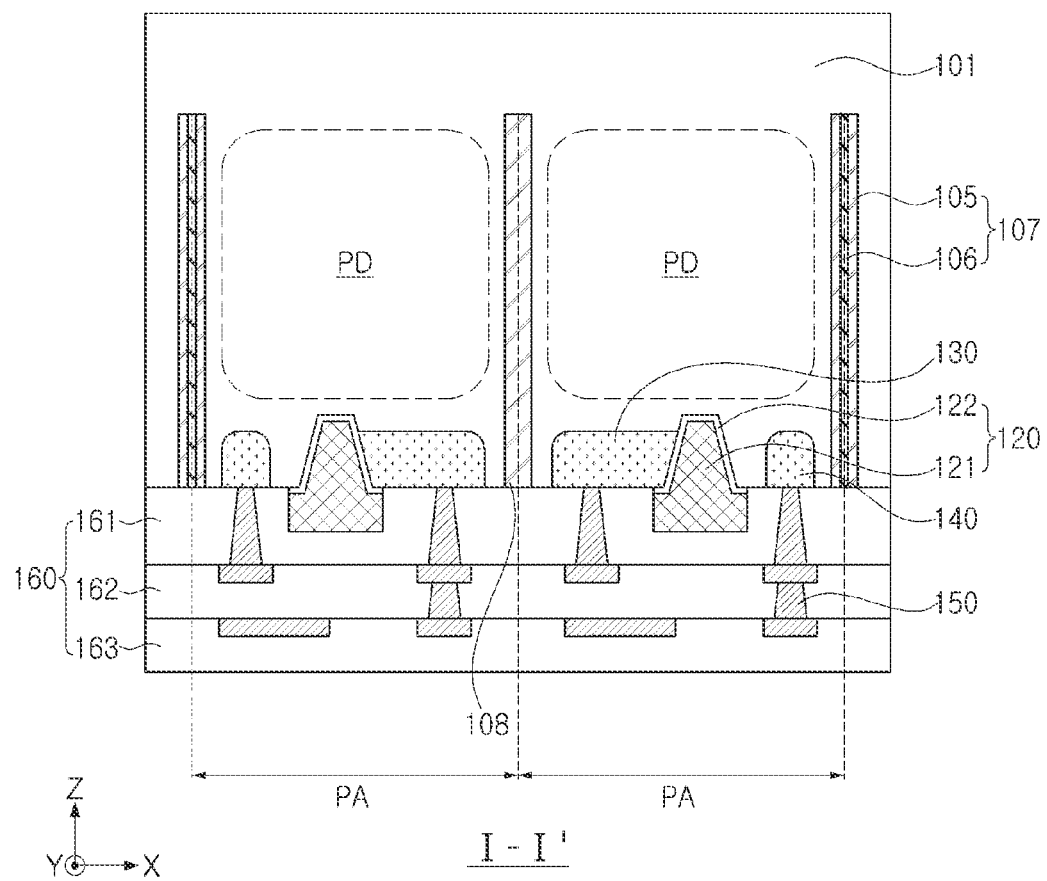
Figure 13:
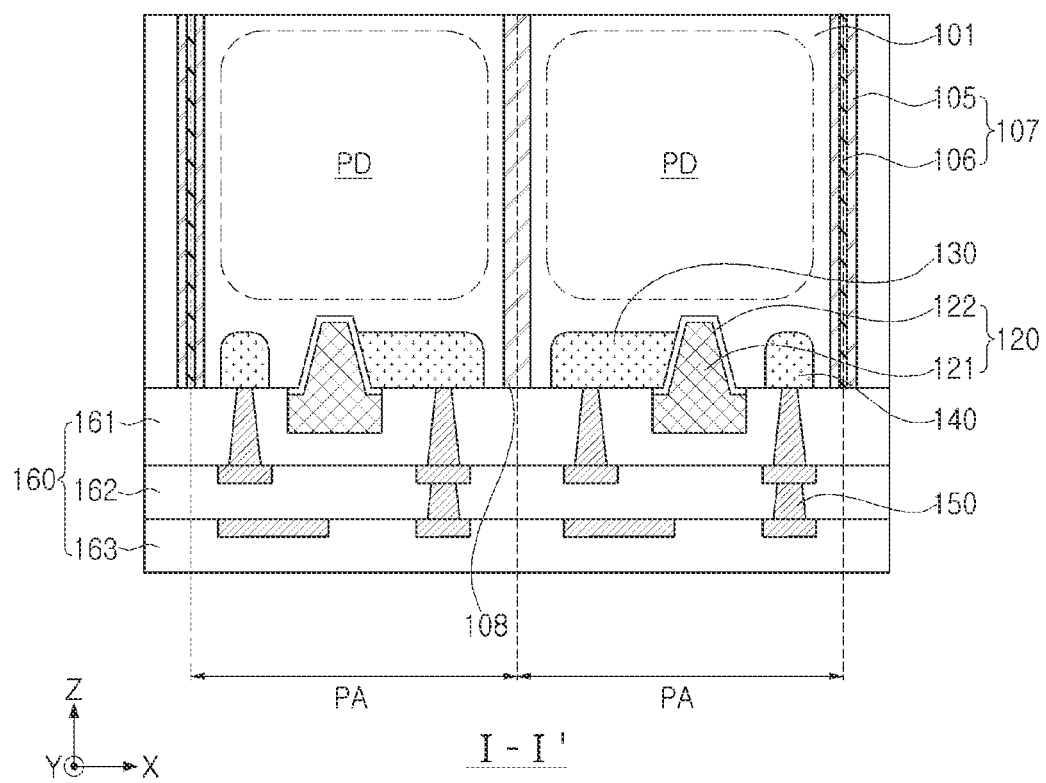

Next, referring to FIGS. 11 through 13, after the pixel circuit region is formed, the substrate 101 may be turned over, and chemical-mechanical polishing (CMP) for removing a partial region of the substrate 101 may be performed. For example, the CMP may be applied to a surface of the substrate 101. A thickness of the substrate 101 may be reduced by the CMP, and a distance between the photodiode PD and one surface of the substrate 101 may be reduced as illustrated in FIGS. 11 through 13. According to an exemplary embodiment, the pixel isolation layers 107 and 108 may be formed using front deep trench isolation (FDTI) to completely penetrate through the substrate 101. In other words, in the exemplary embodiment illustrated in FIG. 13, a partial region of the substrate 101 may be removed by the CMP, such that the first surface of the substrate 101 may be coplanar with one surfaces of the pixel isolation layers 107 and 108. Accordingly, the thickness of the substrate 101 and the thickness of the pixel isolation layers 107 and 108 in the third direction Z may be the same as each other.

Figure 14:
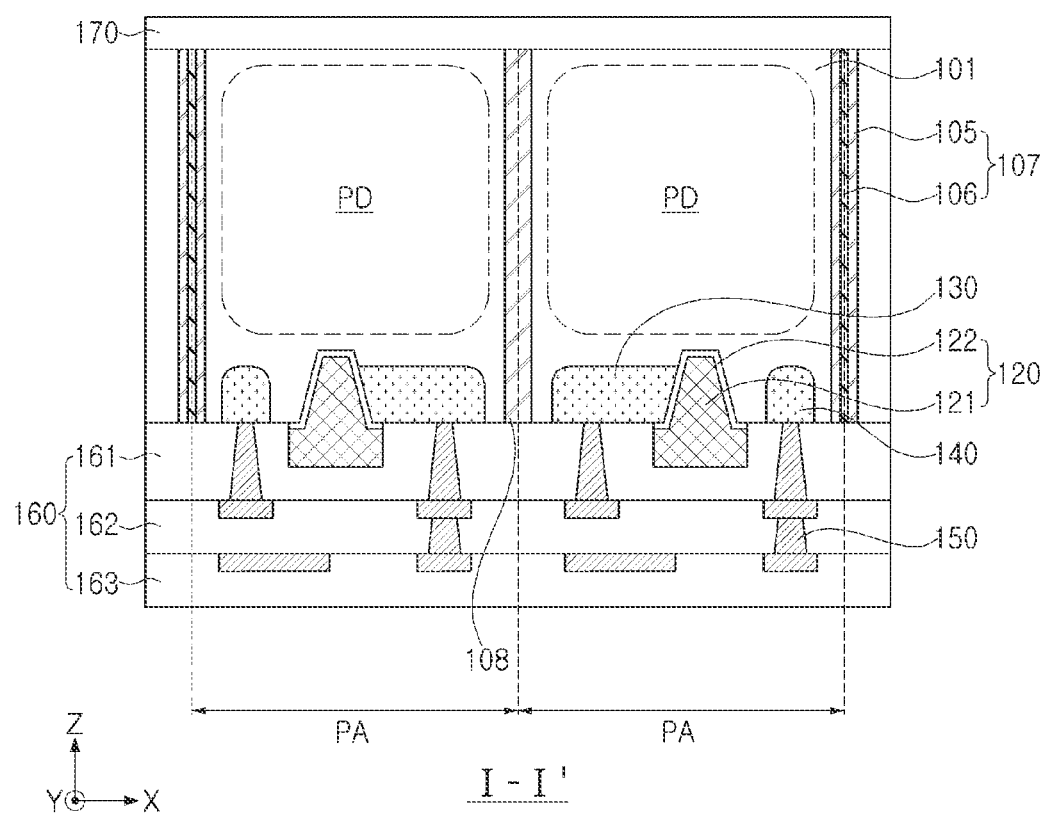

Referring to FIG. 14, the horizontal insulating layer 170 may be formed on the first surface of the substrate 101. The horizontal insulating layer 170 may be formed of a high-k material having a higher dielectric constant than that of silicon oxide, for example, aluminum oxide. The horizontal insulating layer 170 may include a plurality of layers, and in a case where the horizontal insulating layer 170 includes a plurality of layers, at least some of the plurality of layers may be formed of different materials. For example, a layer that directly contacts the substrate 101 among the plurality of layers may be formed of a high-k material. By forming such a horizontal insulating layer 170, defects of the substrate 101 caused by the CMP or the like can be cured.

For example, a dangling bond may occur in the substrate 101 by the CMP or the like, and as a result, excess electric charges may be generated. The excess electric charges generated by the dangling bond or the like may be indistinguishable from photocharges generated by the photodiode (PD) in response to light. Therefore, the dark level characteristic of the image sensor may deteriorate and white spots appearing in the image may be caused. The horizontal insulating layer 170 may cure the defects as described above and remove the excess electric charges, thereby improving the dark level characteristic of the image sensor and significantly preventing the white spots from appearing.

Figure 15:
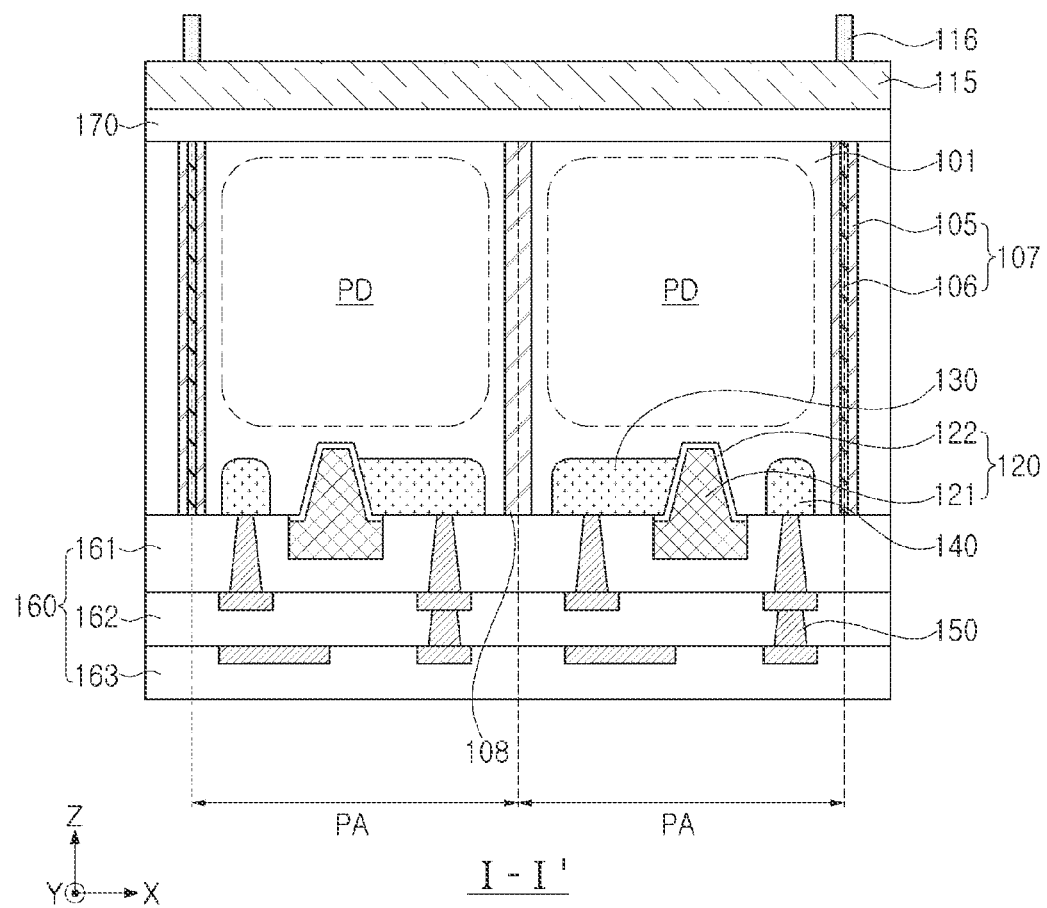

Referring to FIG. 15, a sacrificial layer 115 may be formed on the horizontal insulating layer 170, and a mask layer 116 may be formed on the sacrificial layer 115. For example, the mask layer 116 may be formed at a position corresponding to the first pixel isolation layer 107 in the first direction X and the second direction Y, and the sacrificial layer 115 may be exposed in each of the plurality of pixel region PA by the mask layer 116.

Figure 16:
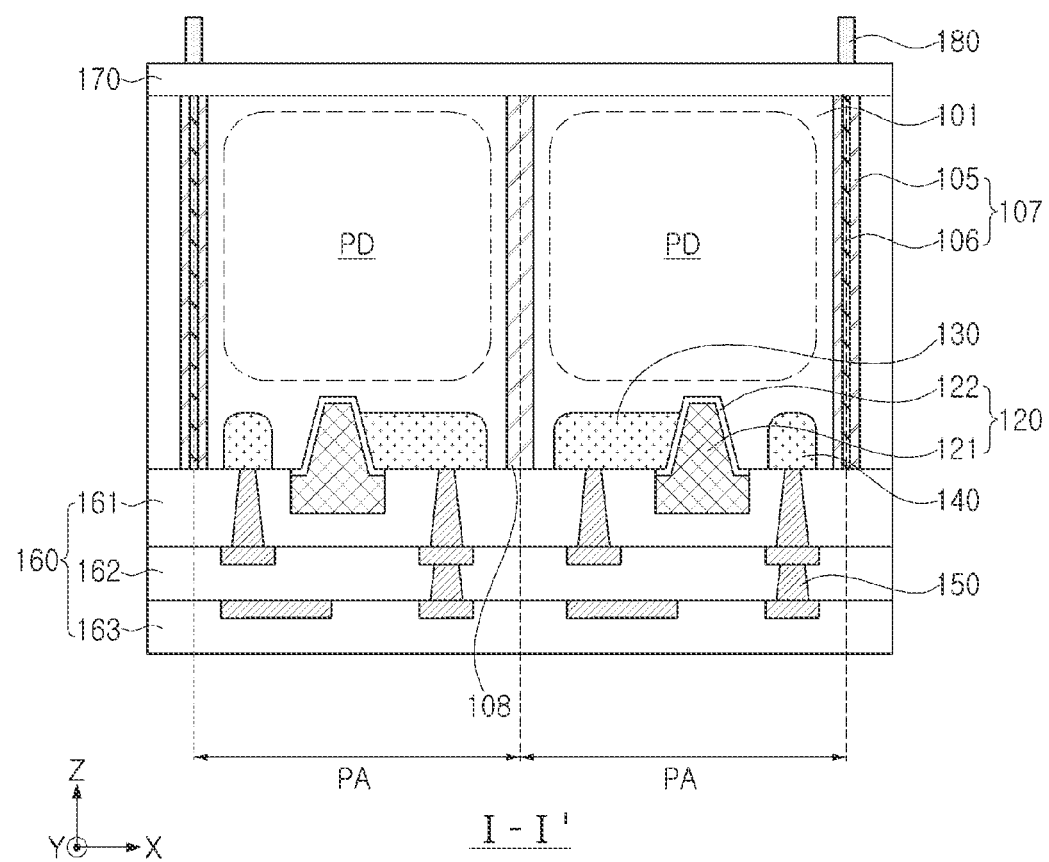

After the mask layer 116 is formed, as illustrated in FIG. 16, etching for removing the sacrificial layer 115 may be performed on a region exposed by the mask layer 116 to form the filter isolation layer 180. The filter isolation layer 180 may extend in the first direction X and the second direction Y and may be formed at a position corresponding to the first pixel isolation layer 107. In the example of FIG. 16, the filter isolation layer 180 has a smaller width than that of the first pixel isolation layer 107, but the width of the filter isolation layer 180 is not necessarily limited thereto.

Figure 17:
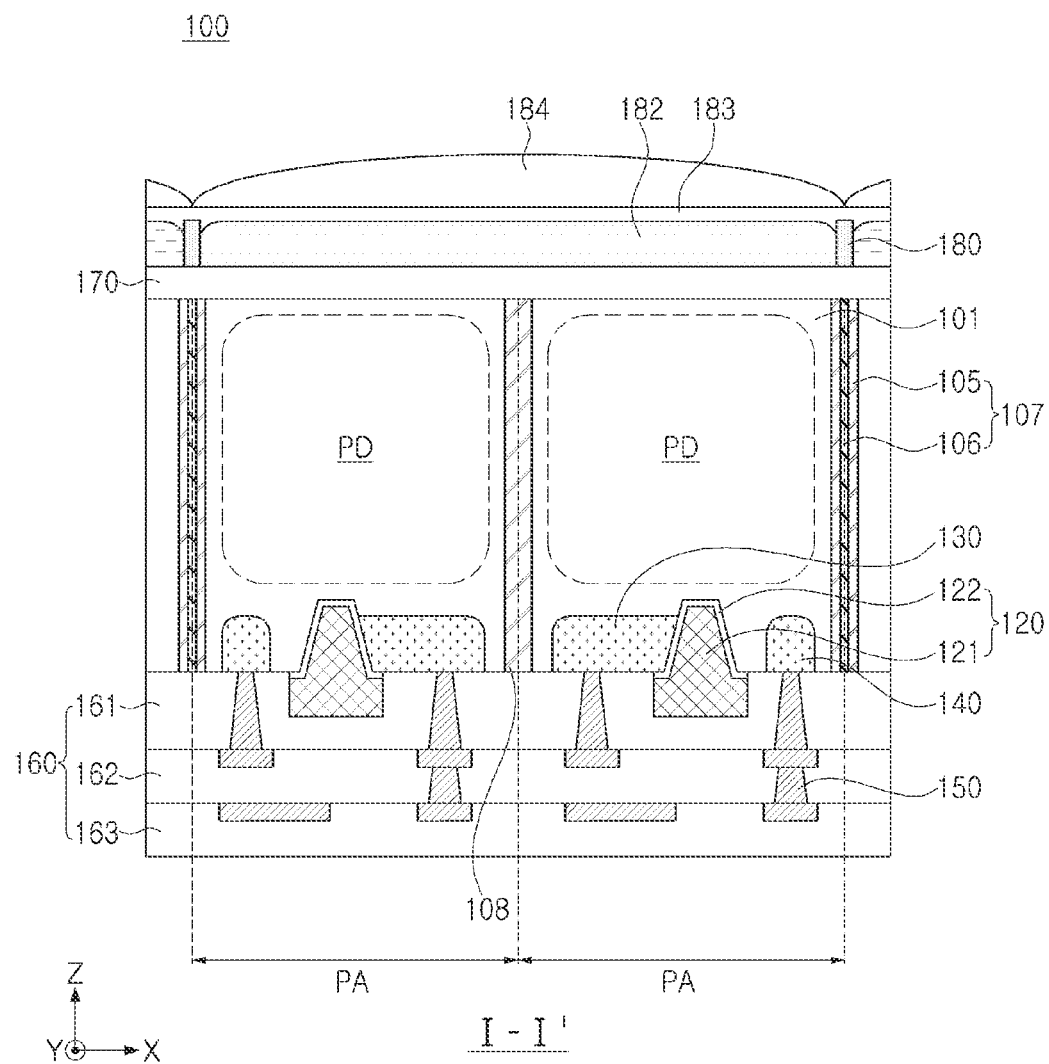

Next, referring to FIG. 17, the color filters 182 may be formed between the filter isolation layers 180, and the planarization layer 183 and the microlenses 184 may be formed on the color filters 182. Referring to FIG. 17, one color filter 182 and one microlens 184 may be shared among the pixels included in the pixel group.

As described above, in the operation of the image sensor 100, light passing through one of the color filters 182 may be incident on the photodiode PD disposed in each of the plurality of pixel regions PA. In order to improve the sensitivity of the image generated by the image sensor 100, it is preferable that as much of the light passing through the color filter 182 enters the photodiode PD. That is, it is necessary to be able to significantly suppress absorption of the light passing through the color filter 182 into the pixel isolation layers 107 and 108. According to an exemplary embodiment in the present disclosure, the second pixel isolation layer 108 between the pixels included in one pixel group does not contain polysilicon and is formed only of silicon oxide or another insulating material different from polysilicon with a higher transmittance than polysilicon. In an embodiment, all the pixels or most of the pixels included in the one pixel group are for detecting a same color. Since the pixel isolation layer 108 may absorb less light as compared with the pixel isolation layer 107 containing polysilicon, the image sensitivity may be increased.

In particular, in a case where the pixels included in one pixel group have a 2×2 matrix structure and share one microlens as illustrated in FIG. 17, light from the microlens may be most concentrated at a point where the second pixel isolation layer 108 makes a cross in the first direction X and the second direction Y. According to an exemplary embodiment in the present disclosure, since the pixel isolation layer 108 may absorb less light as compared with the pixel isolation layer 107, the photodiode PD may effectively absorb the light reflected from the point where the light is most concentrated. Accordingly, the image sensitivity may be improved more effectively.

Meanwhile, according to an exemplary embodiment in the present disclosure, the first pixel isolation layer 107 may still contain polysilicon. According to an exemplary embodiment, a negative bias voltage may be applied to the first pixel isolation layer 107, such that generation of a dark current in the image sensor may be suppressed and the dark level characteristic of the image sensor may be increased. An example of the image sensor whose dark level characteristic may be improved will be described with reference to FIGS. 18 and 19.

Figure 18:
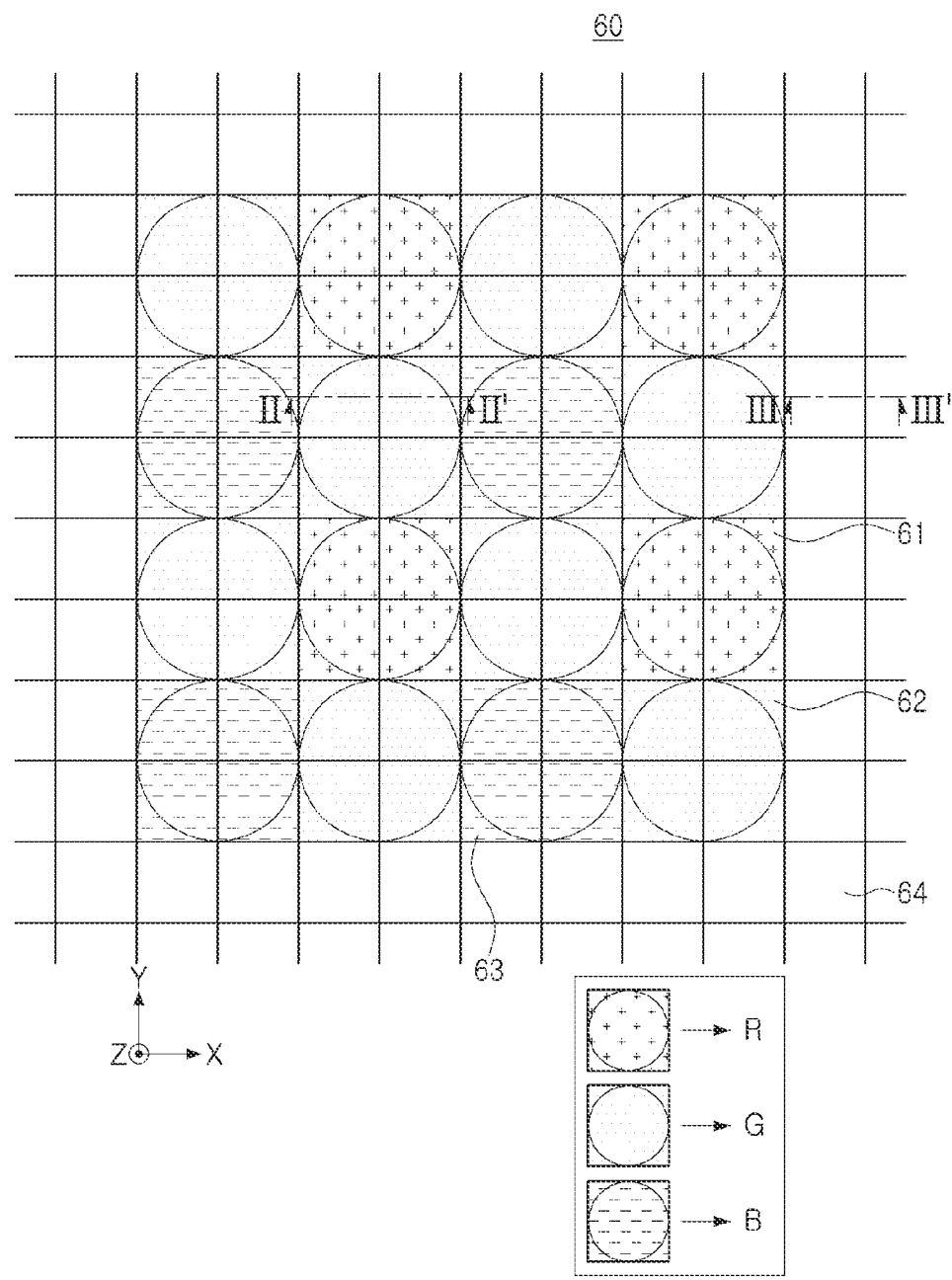
FIGS. 18 through 23 are views illustrating pixel arrays of image sensors according to exemplary embodiments in the present disclosure.
Figure 19:
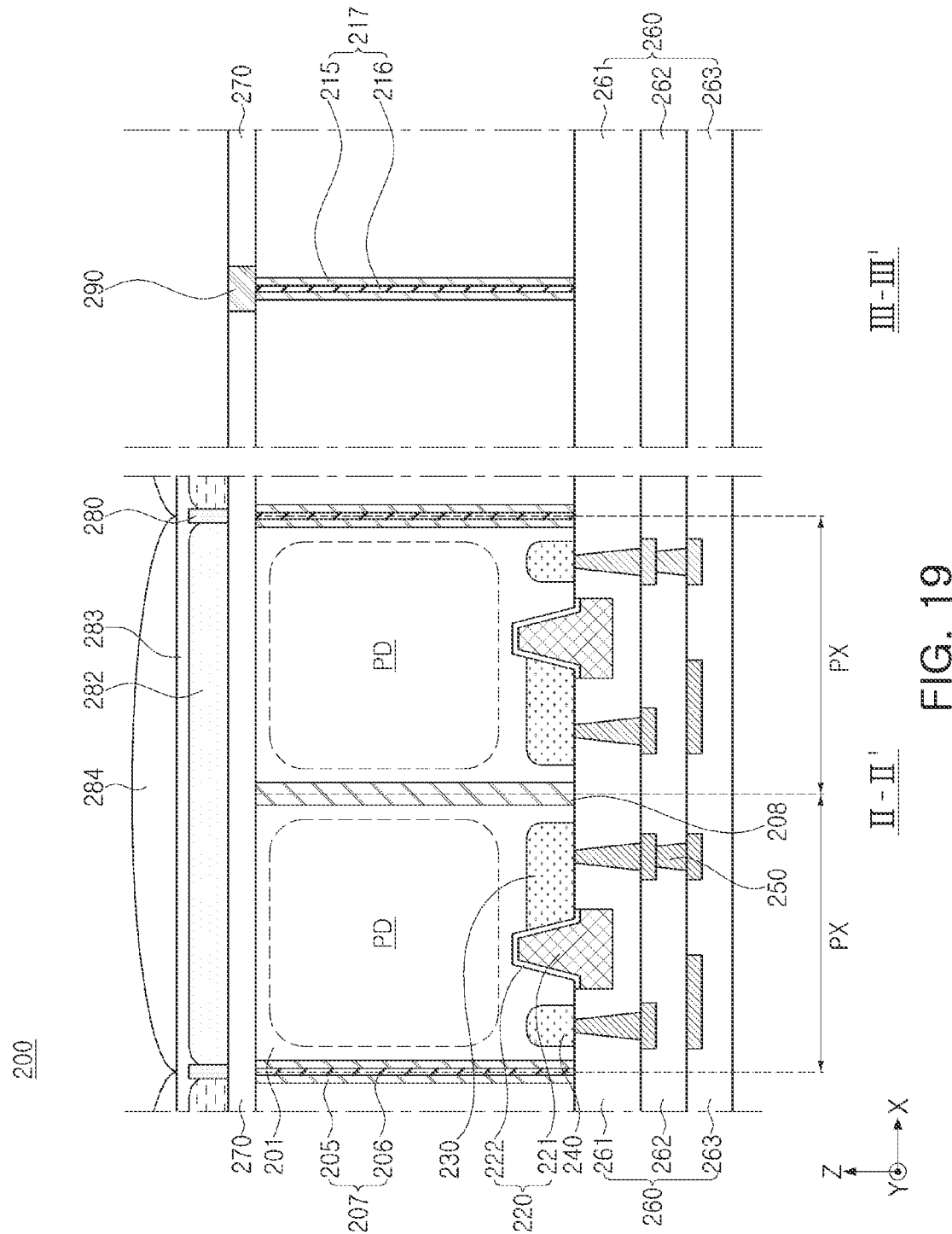

FIGS. 18 and 19 are views illustrating a pixel array of an image sensor according to an exemplary embodiment of the present disclosure.

FIG. 18 is a schematic view illustrating the pixel array of the image sensor according to an exemplary embodiment in the present disclosure. Referring to FIG. 18, a pixel array 60 of the image sensor according to an exemplary embodiment in the present disclosure may include a plurality of pixels 61 to 64 arranged in the first direction X and the second direction Y. For example, the pixel array 60 may include the red pixels 61, the green pixels 62, and the blue pixels 63 provided at a central portion thereof. The red pixels 61, the green pixels 62, and the blue pixels 63 may be referred to as color pixels 61 to 63. The pixel array 60 may further include dummy pixels 64 provided at the periphery of the color pixels 61 to 63.

The color pixels 61 to 63 may correspond to the pixels 51 to 53 described with reference to FIG. 2. The dummy pixels 64 may be defined by a pixel isolation layer, similarly to the color pixels 61 to 63. In an embodiment, the dummy pixels 64 do not include a microlens and a color filter.

According to an exemplary embodiment in the present disclosure, a third pixel isolation layer disposed between the dummy pixels contains polysilicon, similarly to the first pixel isolation layer. The third pixel isolation layer may be electrically connected to the first pixel isolation layer, and receive an external negative bias voltage through a conductive contact.

FIG. 19 is a cross-sectional view illustrating a cross section taken along line II-II' and a cross section taken along line III-III' of FIG. 18.

The cross section taken along line II-II' represents cross sections of the pixels included in the pixel group, and the cross section taken along line III-III' represents a cross section of the dummy pixel. The cross section taken along line II-II' may be similar to that illustrated in FIG. 17.

Referring to FIG. 19, a substrate 201, an interlayer insulating layer 260, and a horizontal insulating layer 270 may also extend to a dummy pixel region. A first pixel isolation layer 207 may be formed by depositing silicon oxide 215 in a trench of the substrate 201 and filling the remaining space with polysilicon 216. A third pixel isolation layer 217 may be formed on the substrate 201 in the dummy pixel region in the same way as a first pixel isolation layer 207 is formed. That is, the third pixel isolation layer 217 may be formed by depositing silicon oxide 215 in a trench of the substrate 201 and filling the remaining space with polysilicon 216.

The dummy pixel region may further include a conductive contact 290. The conductive contact 290 may be electrically connected to an external wiring layer (not illustrated) and apply a negative bias voltage to the third pixel isolation layer. As illustrated in FIG. 18, the pixel isolation layers may be formed in the first direction (X) and the second direction (Y) to form a grid pattern. Accordingly, the first pixel isolation layer 207 and the third pixel isolation layer 217 may be electrically connected to each other. In an embodiment, a second pixel isolation layer 208 contains only an insulating material having a specific resistance lower than that of polysilicon, and a negative bias voltage is not applied to the second pixel isolation layer 208.

When a negative bias voltage is applied through the conductive contact 290, holes in the substrate 101 may move toward an interface of the first pixel isolation layer 107 and be accumulated. Accordingly, generation of a dark current of the image sensor may be suppressed, and a dark level characteristic of an image generated by the image sensor may be increased.

While, the conductive contact 290 is provided on the horizontal insulating layer 270 of the substrate in the example of FIG. 19, embodiments of the disclosure are not limited thereto. For example, a conductive contact may also be provided on the interlayer insulating layer 260.

As described above with reference to FIGS. 2 through 19, the present disclosure may be applied to a case where pixels included in one pixel group have a matrix structure and share one microlens. However, application of the present disclosure is not limited thereto. Specifically, the present disclosure may also be applied to a case where, in a structure in which adjacent pixels for detecting light of the same color form a pixel group, each of the pixels included in the pixel group includes the microlens. Hereinafter, exemplary embodiments in the present disclosure will be described in detail with reference to FIGS. 20 through 23.

Figure 20:
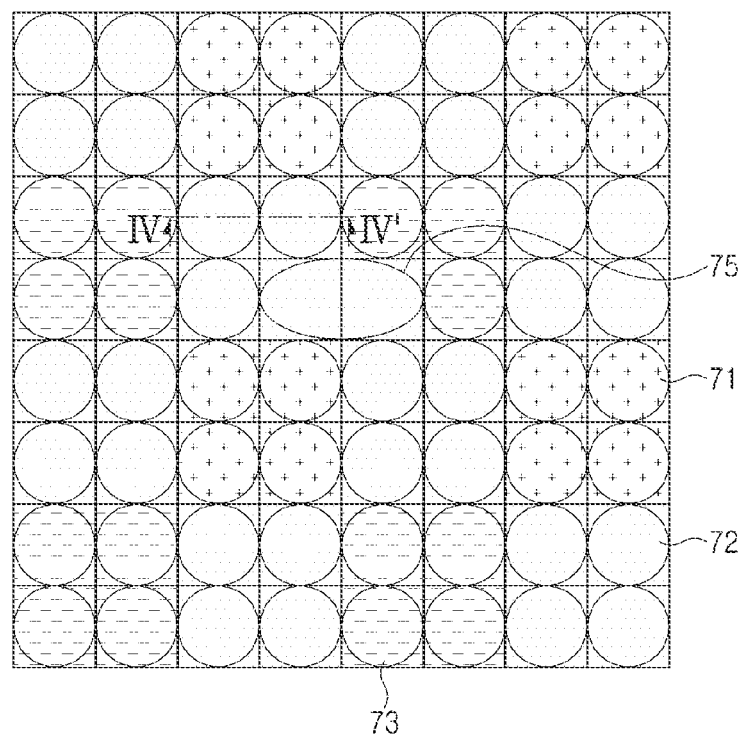
Figure 20:
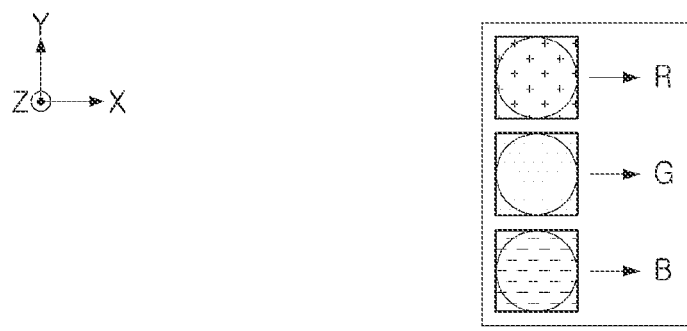

FIG. 20 is a schematic view illustrating a pixel array of an image sensor according to an exemplary embodiment in the present disclosure.

Referring to FIG. 20, a pixel array 70 of the image sensor according to an exemplary embodiment of the present disclosure may include a plurality of pixels 71 to 73 arranged in the first direction X and the second direction Y. The pixels 71 to 73 arranged in the pixel array 70 may be disposed similarly to the pixels 51 to 53 described with reference to FIG. 2. That is, pixels for detecting light of the same color may be arranged in a 2×2 matrix structure to form a pixel group.

However, referring to FIG. 20, each of the pixels included in the pixel group include a microlens. An image obtained by the image sensor in which each pixel includes the microlens may have an excellent signal-to-noise ratio (SNR) and sensitivity. Meanwhile, some of adjacent pixels included in different pixel groups may share a microlens 75, and these pixels may provide an auto focusing (AF) function.

According to an exemplary embodiment of the present disclosure, even in a case where each of the pixels included in the pixel group includes the microlens, a first pixel isolation layer disposed between the pixel groups may contain polysilicon, and a second pixel isolation layer between adjacent pixels in the pixel group does not contain polysilicon and may be formed only of silicon oxide. Since the second pixel isolation layer may absorb less light as compared with the first pixel isolation layer, the sensitivity of the image sensor may be improved.

Figure 21:
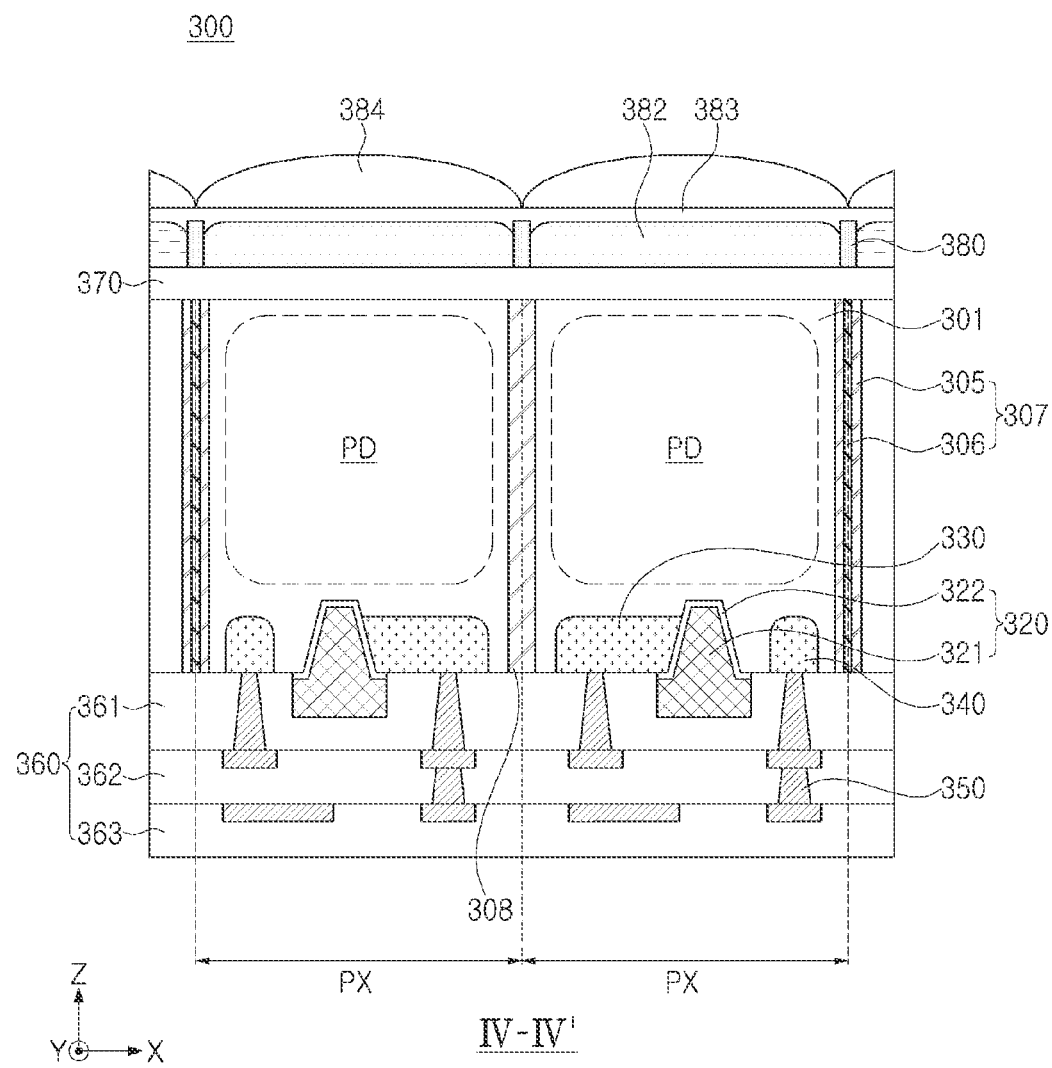

FIG. 21 is a view illustrating the pixel array of the image sensor according to an exemplary embodiment in the present disclosure. Specifically, FIG. 21 may be a cross-sectional view illustrating a cross section taken along line IV-IV' of FIG. 20.

An image sensor 300 illustrated in FIG. 21 may have a structure similar to that of the image sensor 100 described with reference to FIG. 6. However, each of pixels included in the image sensor 300 include one microlens 384 and one color filter 382.

According to an exemplary embodiment of the present disclosure, silicon oxide 305 is be deposited on a surface of a first pixel isolation layer 307 disposed between the pixels including the color filters of different colors, and a space remaining after the silicon oxide 305 is deposited may be filled with polysilicon 306. Accordingly, the occurrence of the crosstalk between the pixels for detecting light of different colors may be prevented.

According to an exemplary embodiment, the image sensor 300 may further include dummy pixels and a third pixel isolation layer disposed between the dummy pixels, and the first pixel isolation layer 307 may be connected to the third pixel isolation layer and receive a negative bias voltage, similar to that described with reference to FIG. 19. Accordingly, the dark level characteristic of an image obtained through the image sensor 300 may be increased.

In an embodiment, the second pixel isolation layer 308 disposed between the pixels including the color filters of the same color does not contain polysilicon and may be filled with silicon oxide. Since the second pixel isolation layer 308 may absorb less light as compared with the first pixel isolation layer 307, the sensitivity of the image sensor may be increased.

Figure 22:
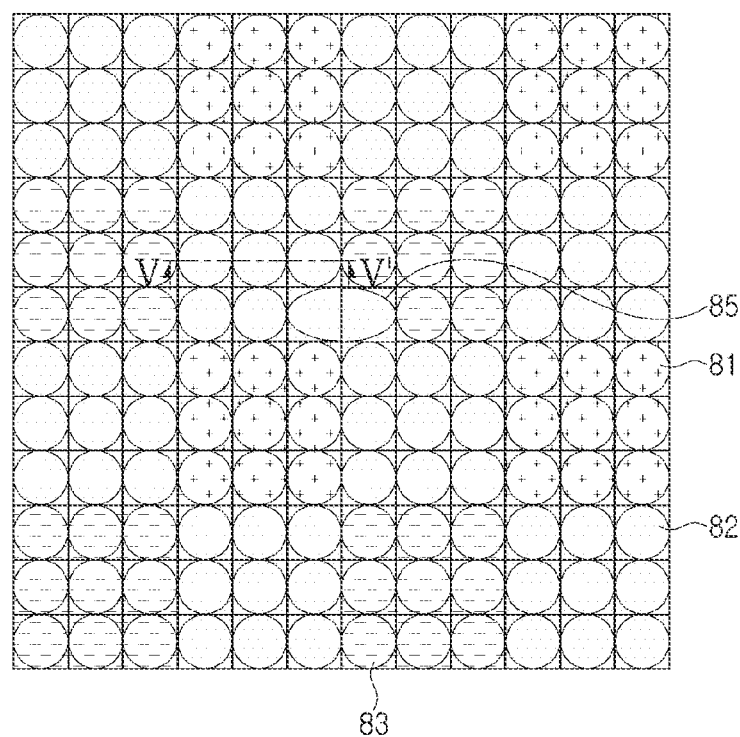
Figure 22:
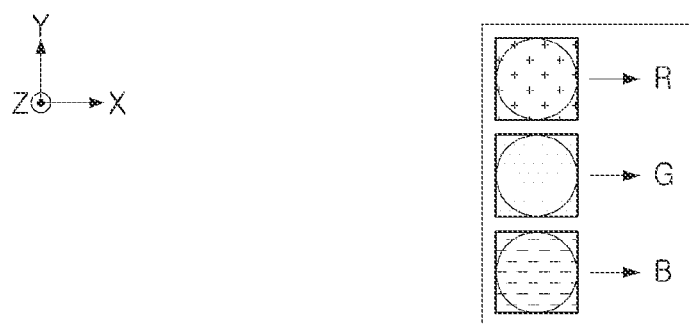

FIG. 22 is a schematic diagram illustrating a pixel array of an image sensor according to an exemplary embodiment in the present disclosure.

Referring to FIG. 22, a pixel array 80 according to an exemplary embodiment of the present disclosure may include a plurality of pixels 81 to 83 arranged in the first direction X and the second direction Y. Among the pixels arranged in the pixel array 80, pixels for detecting light of the same color may be arranged in a 3×3 matrix structure to form a pixel group.

Referring to FIG. 22, each of the pixels included in the pixel group may include a microlens. Meanwhile, some of adjacent pixels included in different pixel groups may share a microlens, and these pixels may provide the auto focusing (AF) function.

Figure 23:
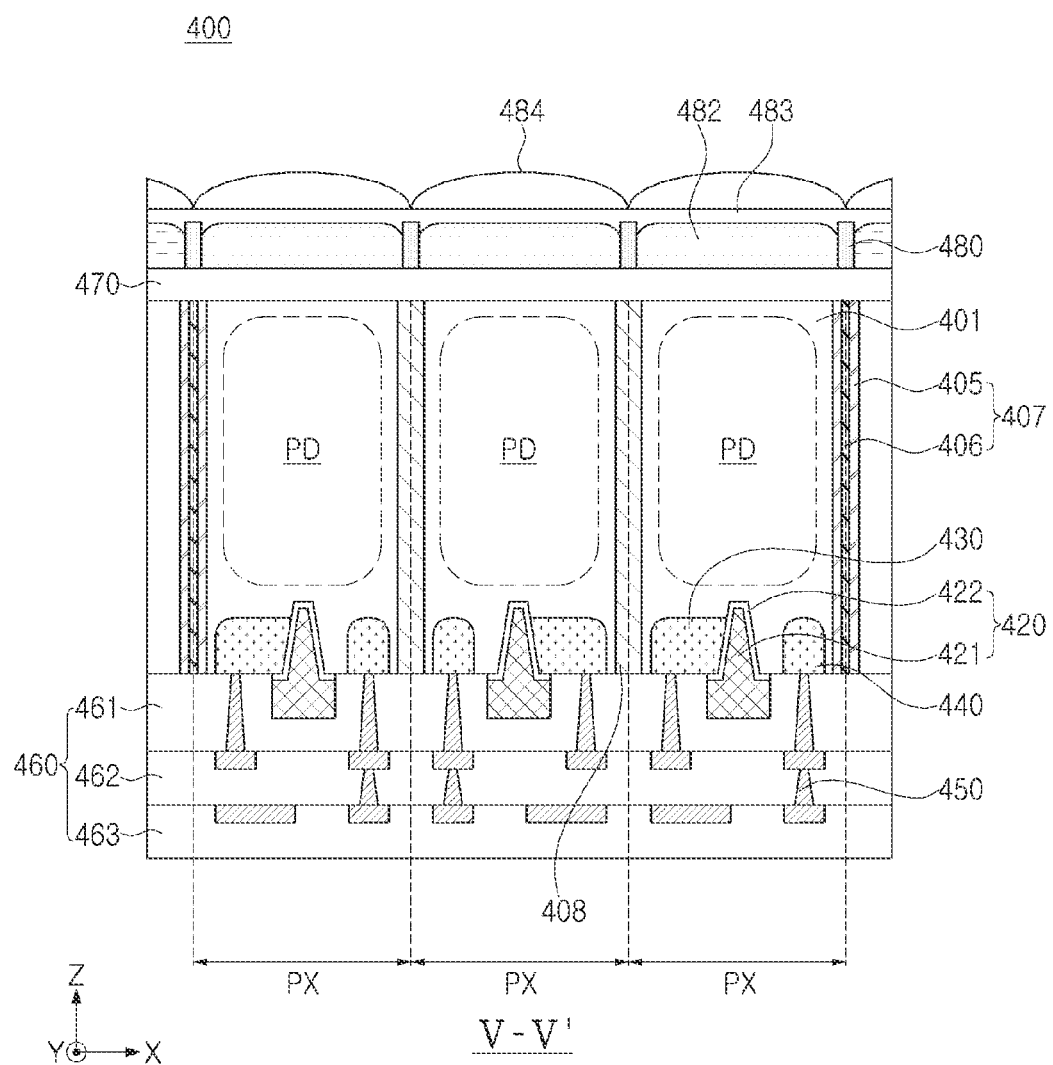

FIG. 23 is a view illustrating the pixel array of the image sensor according to an exemplary embodiment in the present disclosure. Specifically, FIG. 23 is a cross-sectional view illustrating a cross section taken along line V-V' of FIG. 22.

An image sensor 400 illustrated in FIG. 23 has a shape in which three pixels for detecting light of the same color are adjacent to one another in the first direction X. Referring to FIGS. 22 and 23, nine pixels for detecting light of the same color form a pixel group and may be adjacent to one another in the first direction X and the second direction Y. Each of the pixels included in the pixel group may include a microlens 484 and a color filter 482.

According to an exemplary embodiment in the present disclosure, silicon oxide 405 is deposited on a surface of a first pixel isolation layer 407 disposed between the pixels including the color filters of different colors, and a space remaining after the silicon oxide 405 is deposited may be filled with polysilicon 406. In an embodiment, a second pixel isolation layer 408 disposed between the pixels including the color filters of the same color does not contain polysilicon and may be filled with silicon oxide. Accordingly, the image sensitivity may be improved while significantly suppressing image quality degradation due to the crosstalk between adjacent pixels. In an embodiment, the second pixel isolation layer 408 includes a first portion arranged in the first direction X, a second portion arranged in the first direction X parallel and spaced apart from the first portion, a third portion arranged in the second direction Y to cross the first and second portions, and a fourth portion arranged in the second direction Y to cross the first and second portions and parallel to and spaced apart from the third portion. The portions of the second pixel isolation layer 408 may form a grid shape such as a tic-tac-toe shaped grid to surround the pixels. For example, the first portion may be located between first and second rows of pixels, the second portion may be located between second and third rows of pixels, the third portion may be located between first and second columns of pixels, and the fourth portion may be located between second and third columns of pixels.

According to the exemplary embodiments of the present disclosure described with reference to FIGS. 1 through 23, the first pixel isolation layer disposed between the pixels detecting light of different colors and the second pixel isolation layer disposed between the pixels detecting light of the same color may be formed of different materials. Specifically, the first pixel isolation layer may contain polysilicon, and the second pixel isolation layer does not contain polysilicon and may be formed of silicon oxide.

Since the first pixel isolation layer may have a lower transmittance than that of the second pixel isolation layer, the occurrence of the optical crosstalk between adjacent pixels may be prevented. In addition, since the first pixel isolation layer has conductivity, when an external negative bias voltage is applied, holes may be accumulated around the first pixel isolation layer, such that the dark level characteristic may be increased.

Since the second pixel isolation layer may have a higher transmittance than that of the first pixel isolation layer, light passing through the microlens may be effectively incident on the photodiode without being absorbed by the second pixel isolation layer. The optical crosstalk between the pixels adjacent to both sides of the second pixel isolation layer may occur, but the crosstalk between the pixels for detecting light of the same color may not have a significant adverse influence on the image quality. Accordingly, the image sensitivity may be effectively improved while significantly suppressing image quality degradation.

As set forth above, according to at least one exemplary embodiment of the present disclosure, in the image sensor having a structure in which at least some of pixels having color filters of the same color, respectively, are adjacent to each other, the pixel isolation layer between the pixels including the color filters of the same color, respectively, does not contain polysilicon, such that the sensitivity of the image sensor may be increased.

According to an exemplary embodiment of the present disclosure, the pixel isolation layer between the pixels having color filters of different colors, respectively, may contain polysilicon, and the pixel isolation layer may be connected to a backside contact (BCA) to receive the negative bias voltage. Therefore, deterioration of the dark level characteristic of the image sensor may be prevented.

While exemplary embodiments have been shown and described above, it will be apparent to those skilled in the art that modifications and variations could be made without departing from the scope of the present disclosure as defined by the appended claims.

What is claimed is:
1. An image sensor comprising:
a substrate comprising a first surface and a second surface opposing the first surface;
a first pixel group comprising a first four photodiodes (PDs) arranged in a 2×2 matrix structure in a plan view, a first single color filter on the first four PDs, and a first microlens on the first four PDs;
a second pixel group comprising a second four PDs arranged in the 2×2 matrix structure in the plan view, a second single color filter on second four PDs, and a second microlens on the second four PDs;

a first isolation trench between the first pixel group and the second pixel group and in contact with the second surface; and a second isolation trench between the first four PDs and in contact with the second surface, wherein the first isolation trench comprises N number of layers filling the first isolation trench and each of N number of layers is in contact with the second surface, wherein the second isolation trench comprises M number of layers filling the second isolation trench and each of M number of layers is in contact with the second surface, wherein N and M are integers equal to or greater than 1, wherein N is different from M, wherein the first pixel group is directly adjacent to the second pixel group, wherein the image sensor is configured to receive light through the second surface, and wherein the first single color filter and the second single color filter transmit light of different colors.

2. The image sensor of claim 1, wherein N is greater than M.

3. The image sensor of claim 2, wherein the M number of layers comprise a first silicon oxide layer.

4. The image sensor of claim 3, wherein the N number of layers comprises a second silicon oxide layer.

5. The image sensor of claim 4, wherein the first isolation trench is in contact with the first surface.

6. The image sensor of claim 4, wherein the N number of layers further comprises a second layer different from the second silicon oxide layer, wherein diameter of the second layer in the second isolation trench in a first direction is smaller than outer diameter of the second silicon oxide layer in the second isolation trench in the first direction, wherein the first direction is parallel to the first surface, and wherein the second layer includes polysilicon.

7. The image sensor of claim 6, wherein the first pixel group further comprises a transfer gate structure, and wherein a portion of the transfer gate structure extends into the substrate from the first surface.

8. The image sensor of claim 6, further comprising:

a horizontal insulating layer on the second surface, wherein the horizontal insulating layer comprises aluminum.

9. The image sensor of claim 6, wherein the substrate further comprising:

a dummy pixel region; and a third isolation trench in the dummy pixel region and comprising N number of layers filling the third isolation trench and each of N number of layers is in contact with the second surface.

10. The image sensor of claim 9, wherein the third isolation trench comprises a third silicon oxide layer.

11. An image sensor comprising:

a substrate comprising a first surface and a second surface opposing the first surface;

a first pixel group comprising photodiodes (PDs) arranged in a L×L matrix structure in a plan view, a first single color filter on the PDs of the first pixel group, and a first microlens on the PDs of the first pixel group;

a second pixel group comprising PDs arranged in the L×L matrix structure in the plan view, a single second color filter on the PDs of the second pixel group, and a second microlens on the PDs of the second pixel group;

a first isolation trench between the first pixel group and the second pixel group and in contact with the second surface; and a second isolation trench between the PDs of the first pixel group and in contact with the second surface, wherein the first isolation trench comprises N number of layers filling the first isolation trench and each of N number of layers is in contact with the second surface, wherein the second isolation trench comprises M number of layers filling the second isolation trench and each of M number of layers is in contact with the second surface, wherein L, N and M are integers, wherein N is different from M, wherein N is equal to or greater than 2, wherein M is equal to or greater than 1, wherein the first pixel group is directly adjacent to the second pixel group, and wherein the image sensor is configured to receive light through the second surface.

12. The image sensor of claim 11, wherein N is greater than M.

13. The image sensor of claim 12, wherein the M number of layers comprise a first silicon oxide layer.

14. The image sensor of claim 13, wherein the first isolation trench is in contact with the first surface.

15. The image sensor of claim 14, wherein the second isolation trench is in contact with the first surface.

16. The image sensor of claim 13, wherein the M number of layers does not contain a conductive material.

17. The image sensor of claim 16, wherein the M number of layers only contains the first silicon oxide layer.

18. The image sensor of claim 17, wherein the second isolation trench forms a cross at a central portion of the second microlens.

19. The image sensor of claim 18, wherein the first pixel group further comprises a transfer gate structure, and wherein a portion of the transfer gate structure extends into the substrate from the first surface.

20. The image sensor of claim 18, further comprising:

a horizontal insulating layer on the second surface, wherein the horizontal insulating layer comprises aluminum.

* * * * *